(12) United States Patent
Zhu et al.

(10) Patent No.: US 10,810,768 B2
(45) Date of Patent: *Oct. 20, 2020

(54) SYSTEM AND METHOD FOR SEGMENTING MEDICAL IMAGE

(71) Applicant: SHANGHAI UNITED IMAGING HEALTHCARE CO., LTD., Shanghai (CN)

(72) Inventors: Wentao Zhu, Houston, TX (US); Tao Feng, Houston, TX (US); Hongdi Li, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/278,250

(22) Filed: Feb. 18, 2019

(65) Prior Publication Data

US 2019/0188884 A1    Jun. 20, 2019

Related U.S. Application Data

(63) Continuation of application No. 15/215,575, filed on Jul. 20, 2016, now Pat. No. 10,210,634.

(51) Int. Cl.
*G06K 9/00* (2006.01)
*G06T 11/00* (2006.01)
(Continued)

(52) U.S. Cl.
CPC ........ *G06T 11/008* (2013.01); *G01R 33/5608* (2013.01); *G06T 7/11* (2017.01);
(Continued)

(58) Field of Classification Search
CPC ....... G06T 7/0081; G06T 7/0012; G06T 7/11; G06T 11/00; G06T 11/003–008;
(Continued)

(56) References Cited

U.S. PATENT DOCUMENTS 8,218,848 B2    7/2012   Lenglet et al.
8,406,495 B2    3/2013   Gagnon et al.
(Continued)

FOREIGN PATENT DOCUMENTS

CN    103908280 A    7/2014
CN    104700438 A    6/2015

OTHER PUBLICATIONS

International Search Report in PCT/CN2016/106192 dated Mar. 29, 2017, 4 pages.
(Continued)

*Primary Examiner* — Jose L Couso
(74) *Attorney, Agent, or Firm* — Metis IP LLC

(57) ABSTRACT

A method for segmenting a medical image is disclosed. The method includes acquiring MR image and PET data during a scan of the object, acquiring an air/bone ambiguous region in the MR image, the air/bone ambiguous region including air voxels and bone voxels undistinguished from each other. The method also includes assigning attenuation coefficients to the voxels of the plurality of regions and generating an attenuation map. The method further includes iteratively reconstructing the PET data and the attenuation map to generate a PET image and an estimated attenuation map. The method further includes reassigning attenuation coefficients to the voxels of the air/bone ambiguous region based on the estimated attenuation map, and distinguishing the bone voxels and air voxels in the air/bone ambiguous region.

20 Claims, 10 Drawing Sheets

(51) Int. Cl.
*G06T 7/11* (2017.01)
*G01R 33/56* (2006.01)
*G01R 33/48* (2006.01)
*G06T 7/187* (2017.01)

(52) U.S. Cl.
CPC .......... *G06T 11/006* (2013.01); *G01R 33/481* (2013.01); *G06T 7/187* (2017.01); *G06T 2207/10088* (2013.01); *G06T 2207/10104* (2013.01); *G06T 2207/10108* (2013.01); *G06T 2207/20056* (2013.01); *G06T 2207/30008* (2013.01); *G06T 2211/424* (2013.01)

(58) Field of Classification Search
CPC ......... G06T 15/08; G06T 2207/10072–10108; G06T 2207/30004; G06T 2207/30008; G06T 2210/41; G01R 33/46; G01R 33/4808; G01R 33/481; G01R 33/4816; G01R 33/4828; G01R 33/485; G01R 33/5607; G01R 33/5608; A61B 5/0033; A61B 5/055; A61B 5/4504; A61B 6/03; A61B 6/032; A61B 6/505; A61B 6/466; A61B 6/5258; A61B 8/483; G01T 1/1603; G01T 1/1648; G06K 9/0057; G06K 9/6267; G06K 2209/051; G06F 19/345; G06F 3/00; A61N 5/1039; Y10S 378/901

See application file for complete search history.

(56) References Cited

U.S. PATENT DOCUMENTS

| | | | |
|---|---|---|---|
| 8,620,053 | B2 | 12/2013 | Michel et al. |
| 8,724,875 | B2 | 5/2014 | Ojha et al. |
| 9,204,817 | B2 | 12/2015 | Thiruvenkadam et al. |
| 9,271,652 | B2 | 3/2016 | Hu et al. |
| 2011/0158497 | A1 | 6/2011 | Schweizer et al. |
| 2013/0336564 | A1 | 12/2013 | Hu et al. |
| 2016/0054416 | A1 | 2/2016 | Stehning et al. |
| 2016/0169994 | A1 | 6/2016 | Hu et al. |
| 2017/0186195 | A1 | 6/2017 | Lin et al. |
| 2018/0114314 | A1 | 4/2018 | Butler et al. |
| 2018/0310856 | A1* | 11/2018 | Weiss .................... A61B 5/055 |

OTHER PUBLICATIONS

Written Opinion in PCT/CN2016/106192 dated Mar. 29, 2017, 4 pages.
First Office Action in Chinese Application No. 201611136335.1 dated Jun. 16, 2020, 24 pages.

* cited by examiner

SYSTEM AND METHOD FOR SEGMENTING MEDICAL IMAGE

CROSS-REFERENCE TO RELATED APPLICATION

The application is a Continuation of U.S. application Ser. No. 15/215,575, filed on Jul. 20, 2016, now U.S. Pat. No. 10,210,634, the contents of which are hereby incorporated by reference.

TECHNICAL FIELD

This application generally relates to a system and method for segmenting medical images, and specifically, relates to a system and method for segmenting bone and air in an MR image based on nuclear emission data.

BACKGROUND

Radionuclide imaging, including single photon emission computed tomography (SPECT) and Positron emission tomography (PET), etc., is a quantitative technology for imaging metabolic pathways and dynamic processes in vivo. It may reflect the change of cell metabolism and function at the molecular level. In a clinical environment, radionuclide images may be interpreted visually to assess the physiologic function of tissues, organs, and/or organ systems. Magnetic resonance (MR) imaging may provide versatile soft-tissue contrast, yielding diagnostic accuracy without exposing a patient to ionizing radiation. The combination of PET imaging and MR imaging may provide many advantages such as higher soft-tissue contrast, reduced radiation exposure, and advanced MR imaging techniques such as diffusion imaging, perfusion imaging, and MR spectroscopy. However, the combination is challenging because of low signal intensity of cortical bone in conventional MR imaging. Low signal intensity of cortical bone makes it difficult to differentiate bone tissue from air cavities in MR imaging.

Thus, there exists a need in the field to provide a method and system for the separation of bone and air in MR image.

SUMMARY

The present disclosure provided herein relates to segmenting medical images. Specifically, the present disclosure relates to a system and method for segmenting bone and air in MR image using nuclear emission data.

Improved PET data quantification is expected to be a main advantage of PET/MR, and an accurate attenuation-correction method is necessary for obtaining a precise quantitative measure of the radiotracer concentration. However, the MR imaging signal reflects tissue proton densities or tissue relaxation times, and not electron density. The MR images are not directly related to the tissue linear attenuation coefficients. They can lack quantification accuracy in brain imaging and in certain whole-body application, such as the imaging of lung and bone marrow, when the segmented tissue classes have high attenuation coefficient variability or too few tissue classes are used.

A method for segmenting medical image may be performed on an anatomic image so as to facilitate the tissue classification or identification. The method may include one or more of the following operations. A first type of medical image may be acquired via reconstructing a first type of data; the first type of medical image may include a plurality of voxels. A second type of data for reconstructing a second type of medical image may be acquired. The first type of medical image may be executed preliminary segmentation, and the first type of medical image may be segmented into a plurality of regions. The plurality of regions may include unambiguous regions and ambiguous regions. An attenuation map may be generated by assigning different attenuation coefficients corresponding to voxels belonging to different regions of the first type of image being executed preliminary segmentation. The second type of medical image may be acquired via iteratively reconstructing the second type of data based on the attenuation map. The attenuation map may be updated after each iteration. An estimated attenuation map may be acquired via iteratively reconstructing the attenuation map during the iterative reconstruction of the second type of data. The voxels of the first type of medical image may be reassigned attenuation coefficients based on the estimated attenuation map. The first type of medical image may be segmented into a plurality of sub-regions distinguished from each other.

In some embodiments, the first type of medical image may be an MR image, and the MR image may be segmented based on at least one approach selected from a thresholding approach, a region growing approach, a histogram approach, an atlas-guided approach, or a clustering approach.

In some embodiments, the ambiguous region may include at least an air/bone ambiguous region, and the unambiguous region includes at least a soft-tissue region.

In some embodiments, values of the voxels in the soft-tissue region may be similar to each other, and values of the voxels in the air/bone ambiguous region may be similar to each other.

In some embodiments, the voxels of the air/bone ambiguous region may be assigned specific attenuation coefficients.

In some embodiments, the specific attenuation coefficients may be equal to attenuation coefficient of water.

In some embodiments, the first type of medical image may be produced by MR device and the second type of medical image is produced by PET device.

In some embodiments, the unambiguous region may include a first soft-tissue region and a second soft-tissue region, and the voxels of the first soft-tissue region may be assigned a first attenuation coefficient, and the voxels of the second soft-tissue region may be assigned a second attenuation coefficient.

In some embodiments, the first attenuation coefficient or the second attenuation coefficient may be updated after each iteration.

In some embodiments, the attenuation coefficient of each voxel in the air/bone ambiguous region may be updated after each iteration.

In another aspect of the present disclosure, a method for segmenting a medical image may include one or more of the following operations. MR data may be acquired during a scan of an object using an MR scanner. An MR image may be reconstructed using the MR data, and the MR image includes a plurality of voxels. PET data may be acquired during a scan of the object using a PET scanner. The MR image may be segmented into a plurality of regions which include at least an air/bone ambiguous region. The air/bone ambiguous region may include air voxels and bone voxel undistinguished from each other. An attenuation map may be generated by assigning attenuation coefficients to the voxels of the plurality of regions. The voxels of the air/bone ambiguous region may be assigned specific attenuation coefficients. The PET data and the attenuation map may be iteratively reconstructed. A PET image and an estimated attenuation map may be generated. The voxels of the air/ bone ambiguous region may be reassigned attenuation coefficients based on the estimated attenuation map.

In some embodiments, the plurality of regions of the MR image may include a soft-tissue region; the soft-tissue region may include voxels of a soft-tissue. The air/bone ambiguous region may be acquired by excluding the voxels of the soft-tissue regions from the MR image.

In some embodiments, values of the voxels in the soft-tissue region may be similar to each other in the MR image, and values of the voxels in the air/bone ambiguous region may be similar to each other in the MR image.

In some embodiments, the attenuation coefficient of each voxel in the air/bone ambiguous region may be updated after each iteration.

In some embodiments, the specific attenuation coefficients of the voxels in the air/bone ambiguous region may be equal to the attenuation coefficients of water.

In some embodiments, the air/bone ambiguous region may be segmented into a first region and a second region. The first region may include only the bone voxels and the second region includes only the air voxels.

In another aspect of the present disclosure, a system for segmenting a medical image is provided. The system may include an image processor, and the image processor may include a first reconstruction module, a segmentation module and a second reconstruction module. The first reconstruction module may acquire an MR image via reconstructing the MR data. The segmentation module may segment the MR image into at least an air/bone ambiguous region and a soft-tissue region, the air/bone ambiguous region may include air voxels and bone voxels undistinguished from each other, and the soft-tissue region may include only voxels of soft-tissue. The second reconstruction module may assign initial attenuation coefficient to each voxel of the MR image being segmented, and generate an attenuation map. Voxels of the air/bone ambiguous region may be assigned attenuation coefficient of water. The second reconstruction module may iteratively update the PET data and the attenuation map to generate a PET image and an estimated attenuation map. The second reconstruction module may further reassign attenuation coefficient to each voxel of the MR image being segmented based on the estimated attenuation map.

In some embodiments, the image processor may further segment the air/bone ambiguous region into a first region, a second region, and a third region. The first region may include only voxels of a rib, the second region may include only voxels of a spine, and the third region may include only voxels of a lung.

In some embodiments, the attenuation coefficient corresponding to the bone voxels in the first region may be different from the attenuation coefficient corresponding to the air voxels in the second region.

In some embodiments, the system for segmenting a medical image may further include an MR scanner, a PET scanner, and a display. The MR scanner may acquire MR data during a first scan of an object. The PET scanner may acquire PET data during a second scan of the object. The display may simultaneously display the PET image and the MR image in an overlaying manner.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting examples, in which like reference numerals represent similar structures throughout the several views of the drawings, and wherein.

DETAILED DESCRIPTION

Figure 1:
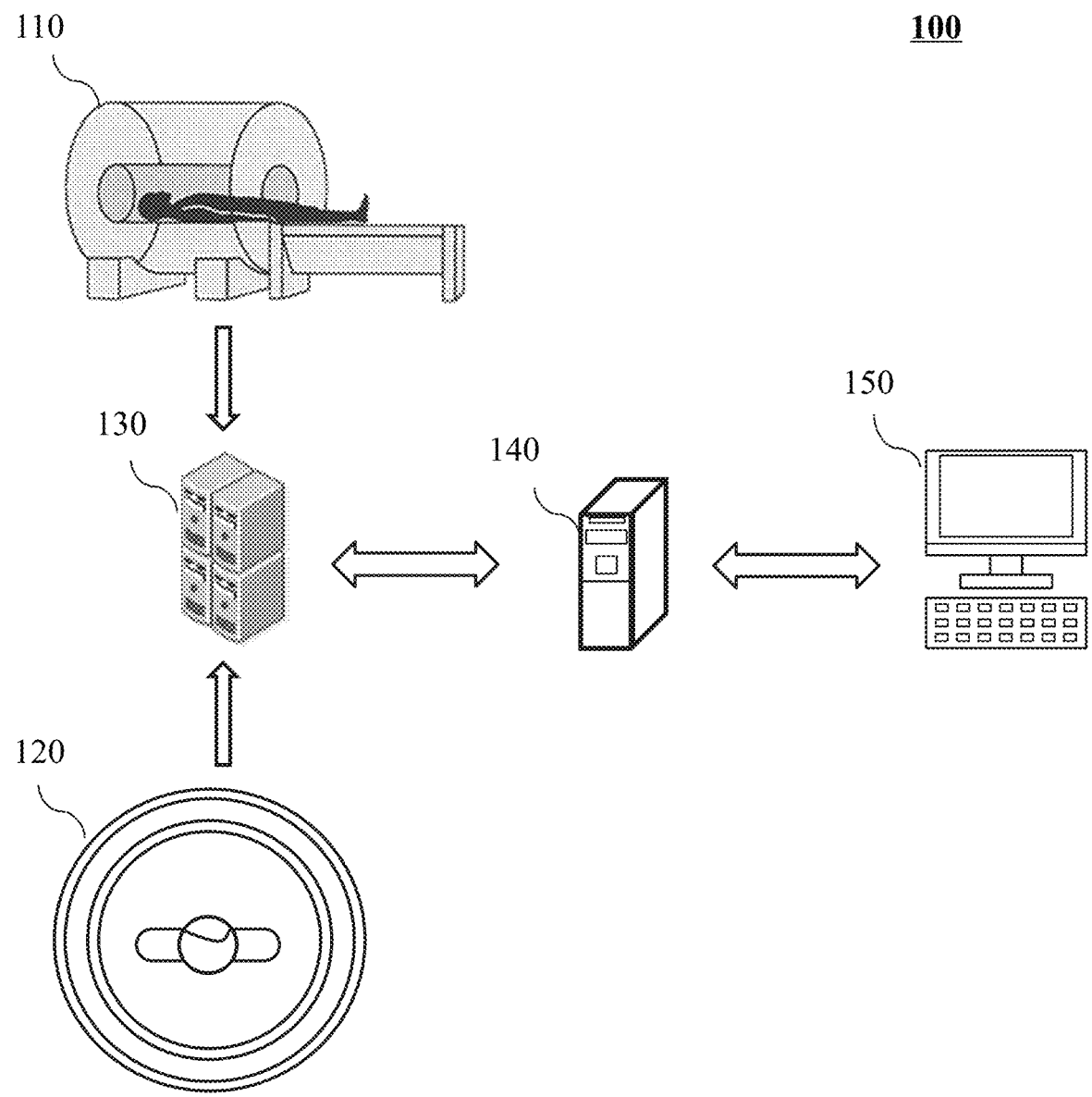
FIG. 1 illustrates a hybrid PET/MR imaging system according to some embodiments of the present disclosure.

In the following detailed description, numerous specific details are set forth by way of example in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

It will be understood that the term "system," "engine," "unit," "module," and/or "block" used herein are one method to distinguish different components, elements, parts, section or assembly of different level in ascending order. However, the terms may be displaced by other expression if they may achieve the same purpose.

It will be understood that when a unit, engine, module or block is referred to as being "on," "connected to," or "coupled to" another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include," and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof. It will be further understood that the terms "constructed" and "reconstruct", when used in this disclosure, may represent a similar process that an image may be transformed from data. In some embodiments, the terms "reconstruct," "estimate" and "update," when used in this disclosure, may represent a similar process of data or image correction.

In some embodiments, the object or subject may be a human being, an animal, an organ, a texture, a region, a lesion, a tumor, or the like, or any combination thereof. Merely by way for example, the object may include a head, a breast, a lung, a trachea, a pleura, a mediastinum, an abdomen, a long intestine, a small intestine, a bladder, a gallbladder, a triple warmer, a pelvic cavity, a backbone, extremities, a skeleton, a blood vessel, or the like, or any combination thereof. In some embodiments, the medical image may include a 2D image and/or a 3D image. In some embodiments, the 3D image may include a series of 2D slices or 2D layers.

For illustration purposes, the following description is provided to help better understanding an image processing. It is understood that this is not intended to limit the scope of the present disclosure. For persons having ordinary skills in the art, a certain amount of variations, changes and/or modifications may be deducted under guidance of the present disclosure. However, those variations, changes and/or modifications do not depart from the scope of the present disclosure.

The application relates to a system and method for segmenting medical images, and specifically, relates to a system and method for segmenting bone and air in an MR image based on nuclear emission data. The system and method disclosed herein exploit the difference between the attenuation properties of bone and air in functional images including, for example, PET images, SPECT images, etc. For instance, bone and cavities that may show similar signal intensities in MR imaging may display different tissue attenuations in PET. The system and method disclosed herein may facilitate resolving ambiguity between, for example, bone and air, in an MR image based on a functional image.

FIG. 1 shows an exemplary diagram of an imaging system 100 for segmenting an image according to some embodiments of the present disclosure. In some embodiments, the imaging system 100 may be a hybrid imaging system. In some embodiments, the hybrid imaging system may be a PET/MR imaging system, or a PET/CT imaging system. In some embodiments, the hybrid imaging system may acquire data of various types. For example, a first type of data (also referred to as "first data") (e.g., MR data, CT data, or the like) and a second type of data (also referred to as "second data") (e.g., PET data, or the like) may be acquired. A first type of image (also referred to as "first image") (e.g., an MR image, a CT image, or the like) and a second type of image (also referred to as "second image") (e.g., a PET image, or the like) may be generated based on the first type of data and the second type of data, respectively. For illustration purposes, as described in FIG. 1, the imaging system 100 may include a hybrid PET/MR imaging system. The hybrid PET/MR imaging system 100 may include an MR scanner 110, a PET scanner 120, an image processor 130, a controller 140 and a display 150.

The MR scanner 110 may scan an object (e.g., a portion of a subject) to acquire a plurality of MR data relating to the object. The PET scanner 120 may scan the object to acquire a plurality of PET data relating to the object. In some embodiments, the MR scanner 110 and the PET scanner may be integrated in the hybrid system. In some embodiments, the MR data and the PET data may be acquired simultaneously or successively. In some embodiments, the acquired MR data and PET data may be stored in a storage (e.g., a disk, a cloud storage, not shown in FIG. 1), and may be retrieved when needed.

The image processor 130 may process the MR data and the PET data. In some embodiments, the image processor 130 may generate one or more images or maps based on the MR data and the PET data. The images or maps may include an MR image, a PET image, an attenuation map, an updated PET image, an estimated attenuation map, or the like, or a combination thereof. The MR image may be generated based on the MR data. The PET image may be generated based on the PET data. In some embodiments, the PET image and the attenuation map may be iteratively updated (also referred to as an "iterative reconstruction process") simultaneously or successively, and an estimated (also referred to as "updated") PET image and an estimated (also referred to as "updated") attenuation map may be generated. As used herein, the attenuation map may be generated by assigning attenuation coefficients to the voxels of the MR image; the estimated attenuation map may be acquired by iteratively updating the attenuation map during the iterative reconstruction process.

In some embodiments, the MR image may be segmented into a plurality of regions, including, e.g., at least an ambiguous region and at least an unambiguous region. As used herein, an ambiguous region may refer to that values of voxels in the region may be similar to each other, and therefore the voxels in the region may be undistinguishable from each other. In some embodiments, the ambiguous region may be an air/bone ambiguous region, and the unambiguous region may be a soft-tissue region. In some embodiments, in the air/bone ambiguous region, air voxels and bone voxels may be undistinguishable from each other.

In some embodiments, the image processor 130 may register the MR image with respect to the PET image, or register the PET image with respect to the MR image. The registration may be performed based on an optical flow method, a registration method based on one or more feature points, a registration method based on a contour, a registration method based on grey scale information, etc.

In some embodiments, the image processor 130 may be local or remote. In some embodiments, the MR scanner 110 and the PET scanner 120 may share the image processor 130, or employ their respective image processors.

The controller 140 may control the acquisition process, the processing procedure, or a display process. For example, the controller 140 may control the scanning procedure in the MR scanner 110 or the PET scanner 120. As another example, the controller 140 may control a display parameter (e.g., display size, display scale, resolution, display color, or the like, or a combination thereof) of the display 150. In some embodiments, the controller 140 may be a central processing unit (CPU), an application-specific integrated circuit (ASIC), an application-specific instruction-set processor (ASIP), a graphics processing unit (GPU), a physics processing unit (PPU), a microcontroller unit, a digital signal processor (DSP), a field programmable gate array (FPGA), an ARM, or the like, or any combination thereof.

The display 150 may simultaneously or successively display the PET image and the MR image. In some embodiments, the PET image and the MR image may be displayed in an overlaying manner. The display may include a cathode ray tube (CRT) display, a liquid crystal display (LCD), an organic light emitting display (OLED), a plasma display, or the like, or any combination thereof. In some embodiments, the display 150 may be integrated into a display device. The display device may include a computer, a laptop, a cell phone, a mobile phone, a pad, a glass, a projector, a virtual reality device, or the like, or any combination thereof. In some embodiments, the display 150 may display characteristic information of the object, including height, weight, gender, age, a medical condition of the object, a medical history of the object, an area of interest of the object, or the like, or any combination thereof. The information of the area of interest of the object may further include the position of the object when the object is imaged or scanned (for example, the object lying pronely or supinely on the couch when the object is imaged or scanned), information of an organ of the object, information of a tissue of the object, or the like, or any combination thereof.

Further, while not shown, the imaging system 100 may be connected to a network (e.g., a telecommunications network, a local area network (LAN), a wireless network, a wide area network (WAN) such as the Internet, a peer-to-peer network, a cable network, etc.) for communication purposes.

It should be noted that the above description of the hybrid PET/MR imaging system is merely provided for the purposes of illustration, and not intended to limit the scope of the present disclosure. For persons having ordinary skills in the art, multiple variations and modifications may be made under the teachings of the present disclosure. For example, in some embodiments, the hybrid PET/MR imaging system may further include a storage. The storage may store data acquired or generated by the MR scanner 110, the PET scanner 120, the image processor 130, the controller 140, and/or the display 150. As another example, the imaging system 100 may utilize SPECT image data as the functional image data. However, those variations and modifications do not depart from the scope of the present disclosure.

Figure 2:
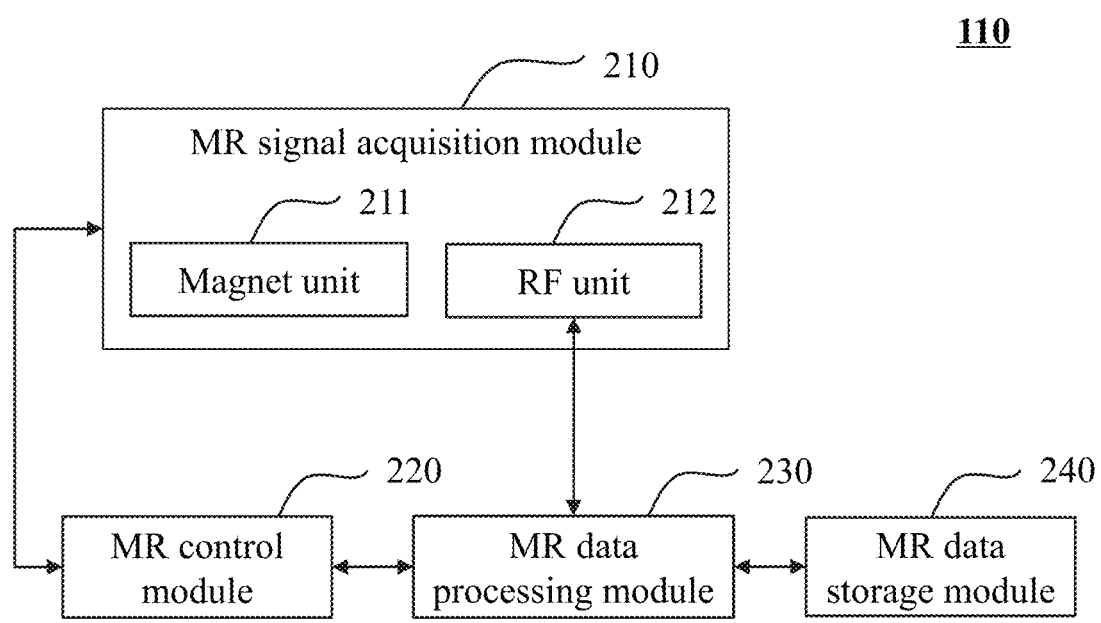
FIG. 2 illustrates a block diagram of an MR scanner according to some embodiments of the present disclosure.

FIG. 2 is a block diagram of the MR scanner 110 according to some embodiments of the present disclosure. As illustrated, the MR scanner 110 may include an MR signal acquisition module 210, an MR control module 220, an MR data processing module 230, and an MR data storage module 240. The MR signal acquisition module 210 may include a magnet unit 211 and a radio frequency (RF) unit 212. The magnet unit 211 may include a main magnet filed generator and/or a gradient magnet field generator (not shown in FIG. 2). The main magnet field generator may create a static magnetic field BO during a scan of object. The main magnet may be of various types including, for example, a permanent magnet, a superconducting electromagnet, a resistive electromagnet, etc. The gradient magnet field generator may generate magnet field gradients to the main magnet field BO in the X, Y, and/or Z directions. The gradient magnet field may encode the spatial information of the object located in the MR scanner 110. The RF unit 212 may include RF transmitting coils and/or receiving coils. These RF coils may transmit RF signals to or receive RF signals from a region of interest. In some embodiments, the function, size, type, geometry, position, amount, and/or magnitude of the magnet unit 211 and/or of the RF unit 212 may be determined or changed according to one or more specific conditions. For example, according to the difference in function and size, the RF coils may be classified as volume coils and local coils. In some embodiments of the present disclosure, the volume coils may include birdcage coils, solenoid coil, saddle coil, Helmholtz coil, phased array coil, transverse electro-magnetic coil, loop coil, etc. In some embodiments, the local coils may be phased array coils, and the array may be designed to be used in four-channel mode, eight-channel mode, or 16-channel mode. In some embodiments, the magnet unit 211 and the RF unit 212 may be designed to surround the object to form an open low-field magnetic resonance imaging scanner or closed magnetic resonance imaging scanner.

The MR control module 220 may control the magnet unit 211 and/or the RF unit 212 of the MR signal acquisition module 210, and/or the MR data processing module 230. The MR control module 220 may receive information from or send pulsed parameters to the MR signal acquisition module 210. The MR control module 220 may control the MR data processing module 230. According to some embodiments of the present disclosure, the MR control module 220 may receive commands from a console provided by, e.g., a user, and adjust the magnet unit 211 and/or RF unit 212 to take images of region of interest according to the received commands.

The MR data processing module 230 may process different kinds of information received from different modules. For example, the MR data processing module 230 may process acquired MR data. In some embodiments, the MR data processing module 230 may be a program, an algorithm, and/or a software implemented on the MR control module 220. In some embodiments, the MR data processing module 230 may be an independent system, coordinated with the MR control module 220, including a processer, a controller, a memory, a display, a program, an algorithm, and/or a software. The signal to be processed may be generated from the MR signal acquisition module 210, or acquired from any storage disclosed anywhere in the present disclosure.

For further understanding of the present disclosure, several examples are given below, but the examples do not limit the scope of the present disclosure. For example, in some embodiments, the MR data processing module 230 may process MR signals received from the RF unit 212, and the processing may further include channel combination, frequency encoding, phase encoding, or the like, or any combination thereof. The processing may also include filling the data into the Fourier domain (or referred to as the spatial frequency space or the k-space). Furthermore, the MR data storage module 240 may store MR data generated by the MR data processing module 230.

It should be noted that the above description of the MR scanner 110 is merely provided for the purposes of illustration, and not intended to limit the scope of the present disclosure. For persons having ordinary skills in the art, multiple variations and modifications may be made under the teachings of the present disclosure. For example, in some embodiments, the modules in the MR scanner 110 may include a storage unit respectively. In some embodiments, MR data storage module 240 may be unnecessary. The MR scanner 110 may share a common storage with any other modules or components in the imaging system 100. However, those variations and modifications do not depart from the scope of the present disclosure.

Figure 3:
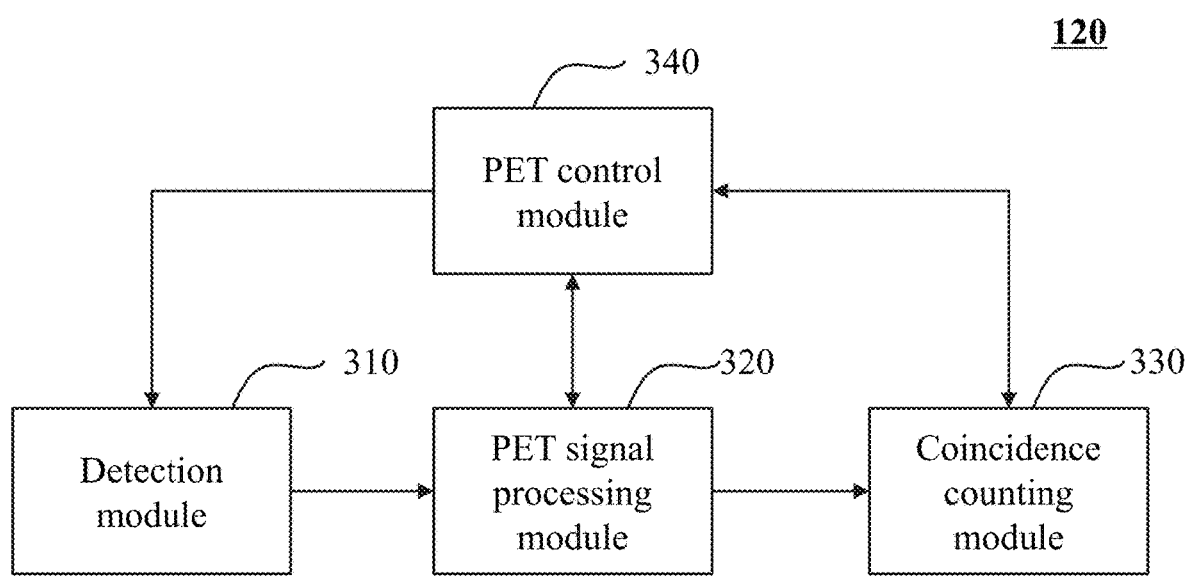
FIG. 3 illustrates a block diagram of a PET scanner according to some embodiments of the present disclosure.

FIG. 3 is a block diagram of the PET scanner 120 according to some embodiments of the present disclosure. The PET scanner 120 may include a detection module 310, a PET signal processing module 320, a coincidence counting module 330, and a PET control module 340. The PET scanner 120 may generate a plurality of PET data during a scan of the object.

In some embodiments, a subject may be located in the PET scanner 120 for an examination, and the subject may be scanned sequentially from the head to the abdomen and the feet, thereby obtaining images of the subject. The detection module 310 may include a plurality of detector cells (not shown in FIG. 3). The detector cells may be arranged in the form of a ring, a part of a ring or cylinder to surround the object being scanned. The detection module 310 may be placed within the wall of a gantry (not shown in FIG. 3). In some embodiments, PET tracer molecules may be first introduced into the object before an imaging session begins during a PET scan. The term "PET tracer" or "tracer" as used herein may refer to a substance that may undergo certain changes under the influence of an activity or functionality within the object, whose activity and/or functionality are to be visualized and/or studied by the PET. Such changes may be chemical and/or physical, during which the PET tracers may emit positrons, namely the antiparticles of electrons. A positron may have the same mass and the opposite electrical charge as an electron, and it may undergo annihilation with an electron (that may naturally exist in abundance within the object) as the two particles collide. An electron-positron annihilation may result in two gamma photons with a certain amount of energy (e.g., 511 keV), which upon their own generation, begin to travel in opposite directions with respect to one another, the detection module 310 may be designed for gamma photons detection, and generate an electric signal.

The PET signal processing module 320 may generate single event data based on the electric signal generated by the detection module 310. The term "single event" as used herein may refer to the detection of a gamma photon by the detection module 310. A single event may be registered when an annihilation gamma-ray is detected. Single event data may include energy values of the detected annihilation gamma-rays, position coordinates for where annihilation gamma-rays are detected, detection times regarding single events, or the like, or any combination thereof. For purposes of illustration, the PET signal processing module 320 may perform detection time measurement processing, position calculation processing, energy calculation processing, or the like, or any combination thereof. For example, in the detection time measurement processing, the PET signal processing module 320 may measure the detection time when annihilation gamma-rays are detected by the detection module 310. More specifically, the PET signal processing module 320 may monitor the peak value of the electric signal generated from the detection module 310, and register the time when the peak value of an electric signal exceeds a threshold as a detection time. The PET signal processing module 320 may detect an annihilation gamma-ray by detecting when the amplitude of the electric signal exceeds the threshold. In the position calculation, the PET signal processing module 320 may calculate an incident position of annihilation gamma-rays based on the electric signal that may be generated by the detection module 310. In the energy calculation, the PET signal processing module 320 may determine an energy value of an annihilation gamma-ray incident based on the detected electric signal.

The coincidence counting module 330 may process single event data relating to a plurality of single events. For the purposes of illustration, the coincidence counting module 330 may determine single event data of two single events that fall within a preset time interval among supplied single event data. The time interval may be set to, for example, approximately 6 nanoseconds to 18 nanoseconds. A pair of single events detected within the time interval may be deemed to originate from a pair of gamma-rays generated from a same annihilation event. A pair of single events resulting from an annihilation event may be called a coincidence event. The line connecting a pair of the detector cells of the coincidence counting module 330 that have detected a coincidence event may be called line of response (LOR). The coincidence counting module 330 may count coincidence events for each LOR. PET data relating to coincidence events may be referred to as coincidence event data. In some embodiments, the PET data may be corrected with respect to random coincidences, normalization, dead-time losses, scattering, or the like, or a combination thereof.

Merely by way of example, the PET tracer molecule may be $^{18}$F-fluoro-deoxy-glucose ($^{18}$F-FDG), which is a radioactive analogue of glucose. $^{18}$F-FDG may follow a metabolic pathway similar to glucose in vivo, but may remain trapped within tissues. Thus, in vivo distribution of $^{18}$F-FDG mapped by PET imaging may indicate glucose metabolic activity, which may be of interest in oncology as proliferating cancer cell may have a higher than average rate of glucose metabolism. Merely by way of example, the PET tracer molecule may be $^{13}$N—NH$_3$ for functional imaging of myocardial perfusion. In these embodiments, the in vivo distribution of $^{13}$N—NH$_3$ may be used to distinguish between viable and non-viable tissue in poorly perfused areas of the heart of a subject, which may be of interest in cardiology to identify candidates for coronary by-pass surgery.

Further provided below is a non-exhaustive list of exemplary organic PET tracers that may be used in connection with the present system. In some embodiments, the PET tracer molecules may include $^{11}$C-methionine, which may act as a marker for protein synthesis in oncology. In some embodiments, the PET tracer molecule may include $^{11}$C-flumazenil, which may act as a marker for benzodiazepine receptor activity in epilepsy. In some embodiments, the PET tracer molecule may include $^{11}$C-raclopride, which may act as a marker for D2 receptor agonist activity for diagnosis of movement disorders. In some embodiments, the PET tracer molecule may include $^{15}$O-carbon dioxide or $^{15}$O-water, which may act as a marker for blood perfusion in a brain. In some embodiments, the PET tracer may include $^{18}$F-fluoride ion, which may act as a marker for bone metabolism in oncology. In some embodiments, the PET tracer molecule may include $^{18}$F fluoro-mizonidazole, which may act as a marker for hypoxia in assessing a subject's response to radiotherapy in oncology. In some embodiments, multiple different PET tracers may be used in combination to produce complementing sets of functional data.

It should be pointed out that, the MR scanner 110 and the PET scanner 120 may be independent of one another in an imaging system. In some embodiments, the MR scanner 110 and the PET scanner 120 may be integrated into a whole body PET/MR hybrid imaging system, and the magnet unit 211 may be located outside the detection module 310 of the PET scanner 120.

It should be noted that the above description of the PET scanner 120 is merely provided for the purposes of illustration, and not intended to limit the scope of the present disclosure. For persons having ordinary skills in the art, multiple variations and modifications may be made under the teachings of the present disclosure. For example, in some embodiments, the PET scanner 120 may further include a storage module used to store data generated by the detection module 310, the PET signal processing module 320, the coincidence counting module 330, and/or the PET control module 340. In some embodiments, at least some of the modules in the PET scanner 120 may include individual storage units. In some embodiments, the function of storing data may be realized by the any storage disclosed anywhere in the present disclosure. However, those variations and modifications do not depart from the scope of the present disclosure.

Figure 4:
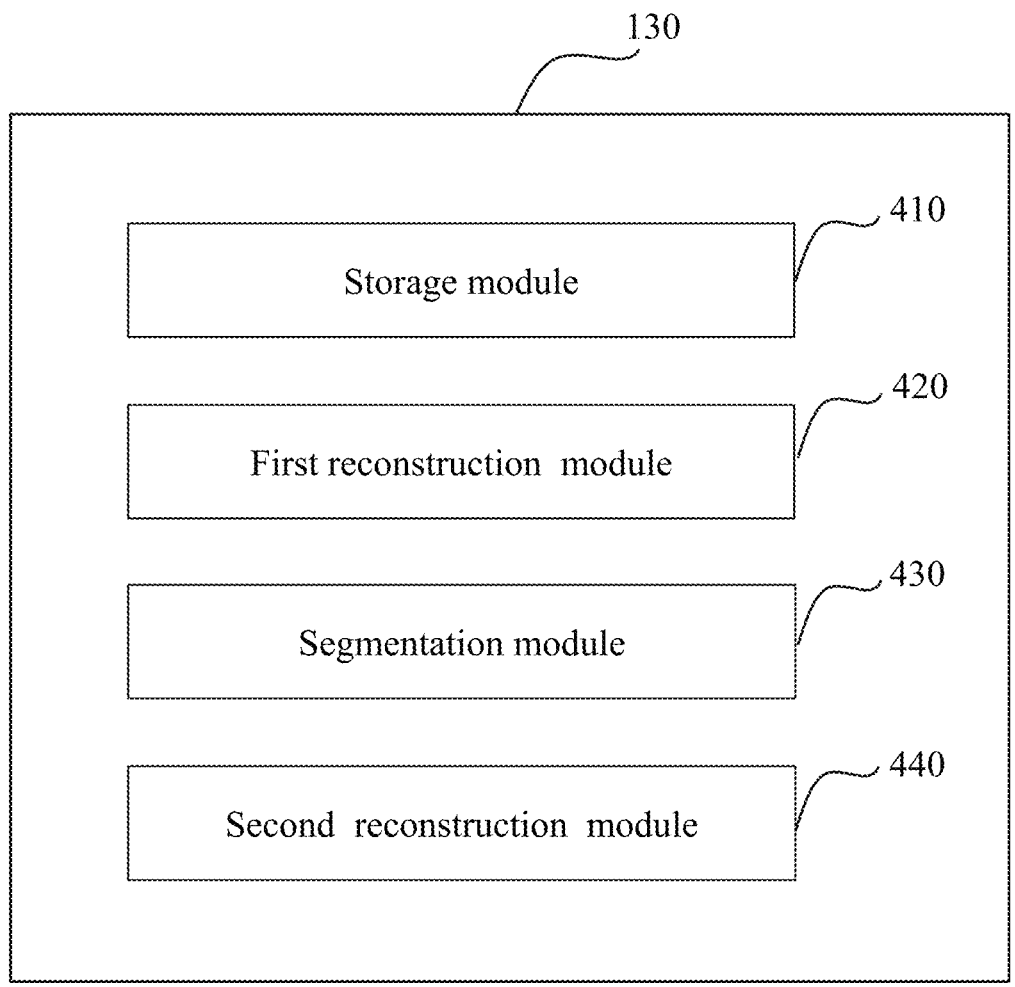
FIG. 4 illustrates a block diagram of a processor according the some embodiments of the present disclosure.

FIG. 4 is a block diagram of the image processor 130 according the some embodiments of the present disclosure. As illustrated, the image processor 130 may include a storage module 410, a first reconstruction module 420, a segmentation module 430, and a second reconstruction module 440. The storage module 410 may store different types of information acquired from various devices (e.g., the MR scanner 110, and/or the PET scanner 120, etc.). The information may include anatomic imaging data, molecule imaging data, or the like, or a combination thereof. In some embodiments, the storage module 410 may store a first type of data and a second type of data. The first type of data may be anatomic imaging data acquired from computed tomography (CT) imaging or magnetic resonance (MR) imaging. The second type of data may be molecule imaging data acquired from functional imaging including, for example, PET imaging, SPECT imaging, etc. Merely by way of example, the first type of data may be MR data, and the second type of data may be PET data.

The first reconstruction module 420 may reconstruct a first type of image of the region of interest (ROI) based on the first type of data. The reconstruction process may include a Fourier transform (FT) of the first type of data. The FT may include a fast Fourier Transform (FFT), a 2-dimensional FT, a 3-dimensional FT, or the like, or any combination thereof. In some embodiments, the first type of data may be MR data, and an MR image may be reconstructed based on the MR data.

The segmentation module 430 may segment the first type of image into a plurality of regions (also referred to as a "preliminary segmentation"), and/or generate an attenuation map by assigning initial attenuation coefficients to voxels of the first type of image. In some embodiments, the method of segmentation may include a thresholding approach, a region growing approach, a histogram approach, an atlas-guided approach, a clustering approach, or the like, or any combination thereof. In some embodiments, the first type of image may include information relating to a bone, a tissue, an organ, a blood vessel, visceral organ, or the like, or any combination thereof. In some embodiments, the plurality of regions may include at least an unambiguous region and at least an ambiguous region. As used herein, an ambiguous region may indicate that the values of voxels in the region may be similar to each other, and therefore the voxels in the region may be undistinguishable from each other. In some embodiments, the initial attenuation coefficients may be retrieved from a database (not shown in FIG. 4). In some embodiments, the initial attenuation coefficients may be acquired from a user (e.g., a doctor, etc.). In some embodiments, voxels in different regions may be assigned different initial attenuation coefficients.

In some embodiments, the first type of image may be an MR image generated by the first reconstruction module 420. The MR image may include at least one ambiguous region. The ambiguous region in the MR image may be an air/bone ambiguous region including air voxels and bone voxels undistinguishable from each other. The MR image may include at least one unambiguous region. The unambiguous region in the MR image may include a soft-tissue region including only voxels of a soft-tissue.

In some embodiments, the MR image may be segmented into a plurality of regions. For instance, the MR image may be segmented into at least three regions. An attenuation map may be generated by assigning initial attenuation coefficients to voxels of the three regions. The three regions may include an air/bone ambiguous region and two soft-tissue regions. The two soft-tissue regions may include a first soft-tissue region corresponding to a first soft tissue type and a second soft-tissue region corresponding to a second soft tissue type. The two soft tissue types may correspond to different attenuation coefficients, respectively. In some embodiments, values of the voxels within a soft-tissue region may be similar to each other. Voxels in a soft-tissue region may be assigned a same initial attenuation coefficient. In some embodiments, values of the voxels in the air/bone ambiguous region may be similar to each other. Voxels in the air/bone ambiguous region may be assigned a specific initial attenuation coefficient.

The second reconstruction module 440 may process the second type of data. In some embodiments, the second reconstruction module 440 may generate a second type of image based on the second type of data. In some embodiments, the second reconstruction module 440 may update (also referred to as "estimate") the second type of image based on the attenuation map generated by the segmentation module 430. In some embodiments, the second reconstruction module 440 may update (also referred to as "estimate") the attenuation map based on the updated second type of image. In some embodiments, the second type of image and the attenuation map may be iteratively updated (referred to as an "iterative reconstruction process"). In some embodiments, the iteration reconstruction process may include a plurality of iterations, and the attenuation map may be updated after each iteration. In some embodiments, an estimated attenuation map may be generated by after a plurality of iterations in the second reconstruction module 440, and the voxel of the MR image being segmented may be reassigned attenuation coefficient based on the estimated attenuation map.

Furthermore, the image processor 130 may segment the first type of medical image into a plurality of sub-regions distinguished from each other. In some embodiments, the image processor 130 may distinguish the bone voxels and the air voxels in the air/bone ambiguous region. The air/bone ambiguous region may be segmented into a first region and a second region, the first region includes only the bone voxels and the second region includes only the air voxels. In some embodiments, the image processor 130 may segment the air/bone ambiguous region into a first region, a second region, and a third region. In some embodiments, the first region includes only voxels of a rib, the second region includes only voxels of a spine, and the third region includes only voxels of a lung.

Merely by way of example, the second type of data may be PET data acquired from the storage module 410 or the PET scanner 120. A first attenuation map may be generated by assigning attenuation coefficients to voxels of the MR image. The iteration reconstruction process may include: generating a first PET image based on the PET data; estimating/updating the PET image based on the first attenuation map; estimating/updating the first attenuation map based on the first PET image, and generating a second attenuation map; updating the first PET image based on the second attenuation map and generating a second PET image; repeating the above steps and generating a final attenuation map (also referred to as "the estimated attenuation map") and a final PET image (also referred to as "the estimated PET image").

It should be noted that the above description of the image processor 130 is merely provided for the purposes of illustration, and not intended to limit the scope of the present disclosure. For persons having ordinary skills in the art, multiple variations and modifications may be made under the teachings of the present disclosure. For example, in some embodiments, the storage module 410 may be unnecessary. The function of the storage module 410 may be realized by any storage disclosed anywhere in the present disclosure. However, those variations and modifications do not depart from the scope of the present disclosure.

Figure 5:
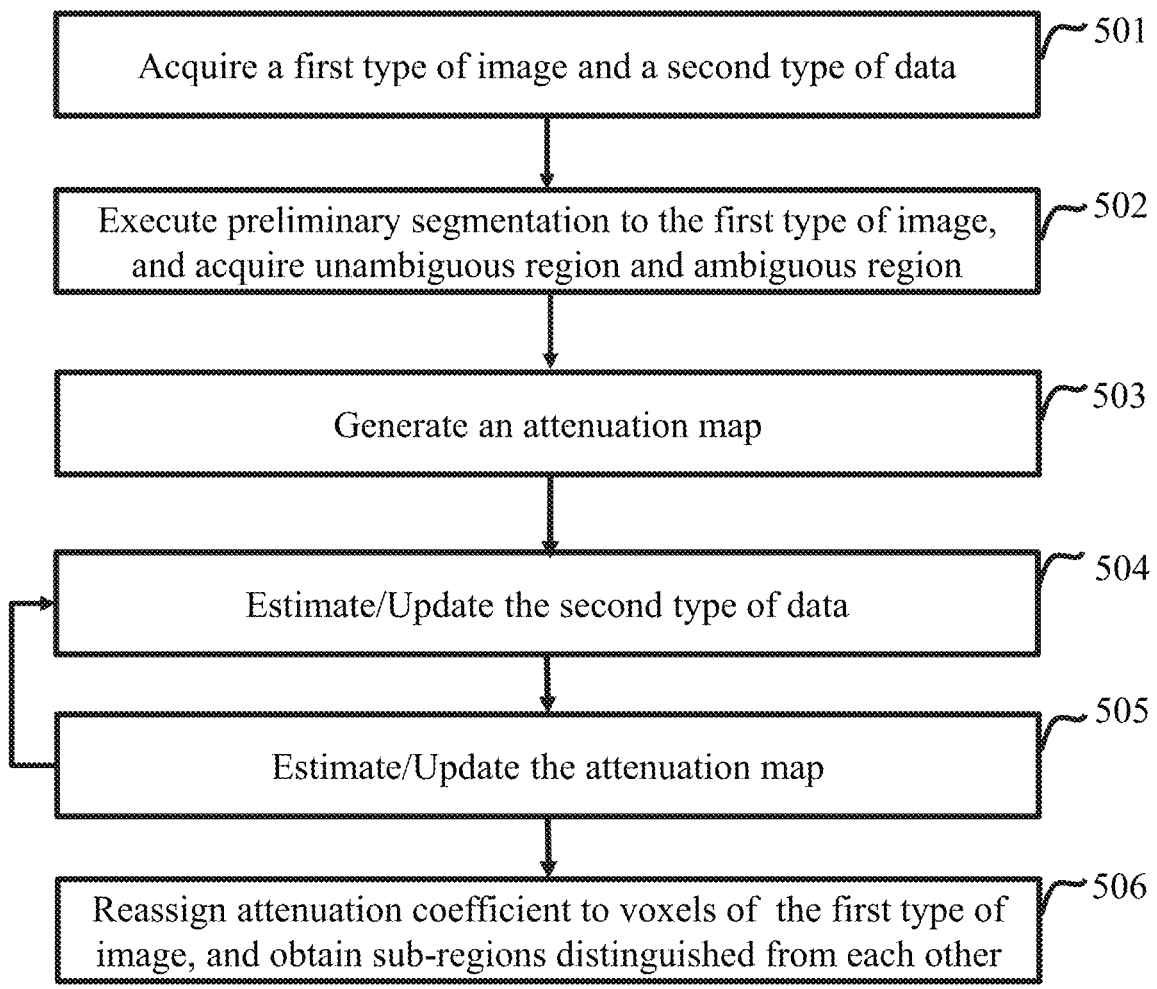
FIG. 5 illustrates a flowchart for segmenting a medical image according to some embodiments of the present disclosure.

FIG. 5 is an exemplary flowchart illustrating a process for processing different types of data according to some embodiments of the present disclosure. In step 501, acquire a first type of image and a second type of data. The first type of image may be reconstructed by a first type of data. In some embodiments, the first type of data may be anatomic imaging data, and the second type of data may be molecular imaging data. In some embodiments, the first type of medical image may be MR image reconstructed by MR data, and the first type of medical image may include a plurality of voxels belonging to various organs. The first reconstruction module 420 may generate the MR image by reconstructing the MR data which may be send from the storage module 410 or the MR scanner 110. The second type of data may be PET data stored in the storage module 410, and the PET data may be acquired by the PET scanner 120. The PET data may be corrected for random coincidences, normalization, dead-time losses, and scatter. In one embodiment, the MR image is acquired before the PET scan but after injecting PET tracer molecules into the object. The MR scan may be performed after the PET scan. The MR scan may be performed before injecting PET tracer molecules. The PET tracer may be a single-tracer (e.g., 18F-FDG, 18F-EF5, 18F-ML-10, etc.) or dual-tracer (e.g., 18F-FDG and 18F-FLT, 11C-ACT and 18F-FDG, etc.) for a PET scanning.

In step 502, execute preliminary segmentation to the first type of medical image, and obtain a plurality of regions, wherein the plurality of regions may include at least an unambiguous region and at least an ambiguous region. The ambiguous region may include voxels belonging to various organs or tissues, and the voxels belonging to different organs may be similar to each other according to the pixel values. The unambiguous region may include voxels belonging to a variety of organ or tissue. In some embodiments, the first type of medical image may be MR image which may be produced by an MR device, and the MR device may include the MR scanner 110 and the first reconstruction module 420.

In some embodiments, the MR image is preliminarily partitioned or segmented into a plurality of regions in the segmentation module 430. The plurality of regions may include at least an unambiguous region and at least an ambiguous region. The ambiguous region may be an air/bone ambiguous region, the air/bone ambiguous region may include air voxels and bone voxels undistinguished or mixed from each other, and values of the voxels in the air/bone ambiguous region are similar to each other. The unambiguous region may be a soft-tissue region, the soft-tissue region only includes voxels of soft-tissue, and values of the voxels in the air/bone ambiguous region may be similar to each other. The segmentation of the MR image may include following steps: segment the MR image into a plurality of soft-tissue regions that only include voxels of soft-tissue; exclude the voxels of the soft-tissue regions from the MR image, and acquire the air/bone ambiguous region. For persons having ordinary skills in the art, the MR image partition or segmentation may use any of variety of the techniques, including but not limited to a thresholding approach, a region growing approach, a histogram approach, an atlas-guided approach, or a clustering approach or a combination of two or more of the above approaches, etc.

In some embodiments, the MR image may be segmented based on an atlas-guided approach. The procedure may include three stages: a rigid registration stage, a non-rigid registration stage, and an atlas-guided segmentation stage. In some embodiments, the MR image may be segmented based on the histogram approach identifying the regions or materials according to the values of voxels. An histogram of voxel datasets over the regions may be acquired by Formula (1):

$$h(v)=\int_{x,y,z}\delta(f(x,y,z)-v)dxdydz, \qquad (1)$$

where, v may denote a certain voxel value; f(x,y,z) may denote the value of a voxel in the MR image; h(v) may denote the number of voxels whose values are equal to v; δ may denote a delta function, in which the value of a voxel is equal to v, δ=1; in other case, δ=0. (x,y,z) may denote three-dimensional coordinate of a voxel in the plurality of regions, x may denotes the x-axis coordinate; y may denote the y-axis coordinate, and z may denote the z-axis coordinate. The boundary of materials or regions may be acquired by a resulting voxel histogram.

In some embodiments, the MR image may be partitioned or segmented into an air/bone ambiguous region, and a plurality of soft-tissue regions. The air/bone ambiguous region may include undistinguishable or mixed air voxels and bone voxels. In the air/bone ambiguous region, values of the voxels in the air/bone ambiguous region may be similar. The segmentation of the MR image may include: segmenting the MR image into a plurality of soft-tissue regions including only voxels of a soft-tissue; excluding the soft-tissue regions from the MR image; and acquiring the air/bone ambiguous region. The plurality of soft-tissue regions may include a first soft-tissue region and a second soft-tissue region. Merely by way of example, the first soft-tissue region may correspond to the liver, and values of the voxels in the first soft-tissue region may be similar to each other or the same. The second soft-tissue region may correspond to the cardiac, and values of the voxels in the second soft-tissue region may be similar to each other or the same.

In step 503, generate an attenuation map by assigning different attenuation coefficients to voxels belonging to different regions of the first type of image being executed preliminary segmentation. In some embodiments, the first type of image may be MR image that is segmented into at least an air/bone ambiguous region, a first soft-tissue region, and a second soft-tissue region as described in step 502. Voxels of the air/bone ambiguous region may be assigned specific attenuation coefficients. In some embodiments, the specific attenuation coefficients may be equal to the attenuation coefficient of water. Voxels of the first soft-tissue region may be assigned a first attenuation coefficient, and voxels of the second soft-tissue region may be assigned a second attenuation coefficient. The first attenuation coefficient may be different from the second attenuation coefficient. For instance, the first attenuation coefficient may be equal to the attenuation coefficient of the liver, and second attenuation coefficienth may be equal to the attenuation coefficient of the cardiac. In some embodiments, the step 502 and the step 503 may be executed in the segmentation module 430.

Iteratively reconstruct the second type of data and the attenuation map to generate a second type of medical image and an estimated attenuation map, or iteratively reconstruct a second type of data based on the attenuation map; the attenuation map may be updated or estimated after each iteration. An estimated attenuation map may be acquired via iteratively updating/estimating or reconstructing the attenuation map during the iterative reconstruction of the second type of data. In some embodiments, an estimated attenuation map and a second type of medical image may be obtained by iteratively reconstruct the attenuation map and a second type of data simultaneously, wherein the attenuation map may be updated after each iteration. The iteration may contain updating or reconstructing the second type of data in step 504 and updating or reconstructing the attenuation map in step 505. In step 504, the second type of data may be updated or reconstructed based on the attenuation map. In step 505, the attenuation map may be updated or reconstructed based on the second type of data being updated. In some embodiments, the attenuation map may be a first attenuation map as described in step 503, and the first attenuation map may be updated to generate a second attenuation map. It should be noted that, the terms "reconstruct", "estimate" and "update", when used for the generation of the second type of medical image in this disclosure, may represent a similar process of the second type of data or image correction. In some embodiments, the terms "reconstruct", "estimate" and "update", when used for the generation of the estimated attenuation map in this disclosure, may represent a similar process of the attenuation coefficients correction.

In some embodiments, the first attenuation map may be continuously updated during a reconstruction of the second type of data in the second reconstruction module 440. The second type of data may be PET data generating from the PET scanner 120. The reconstruction of the PET data may be based on a time-of-flight (TOF) technique. A detection time difference of a pair of annihilation gamma-rays may be measured and/or recorded by a TOF based method. The probability of presence of the pair annihilation point in each voxel on the line of response (LOR) may be different depending on the detection time difference of coincidence events. For example, TOF-PET scan may measure the time difference between the detection of two 511 keV annihilation photons. For the purposes of illustration, taking a reconstruction of the PET scanner 120 for example, the PET data may be updated based on maximum a posteriori (MAP) method in the second reconstruction module 440. A first attenuation map may be generated by assigned attenuation coefficients to voxels of the first type of image being executed preliminary in the segmentation module 430. The process of iteration in the second reconstruction module 440 may include: updating the PET data based on the first attenuation map, and generating a first PET image; then updating the first attenuation map based on the PET data of the first PET image, and generating a second attenuation map. In some embodiments, a second attenuation map may be generated to obtain a third attenuation map. The third attenuation map may be an estimated attenuation map corresponding to a final PET image. The final PET image may be a PET image attenuation corrected by the estimated attenuation map. In some embodiments, the reconstruction of a PET data or the acquisition of the estimated attenuation map may need many times of iterations, the estimated PET image and the estimated attenuation map may be obtained after the final iteration.

In step 506, reassign attenuation coefficients to the voxels of the first type of medical image based on the estimated or final attenuation map. In some embodiments, the voxels of the ambiguous regions may be an air/bone ambiguous region in a MR image which has been executed preliminary segmentation as described in step 502, and the air/bone ambiguous region includes air voxels and bone voxels undistinguished from each other. The attenuation map may be updated by step 505 more than once. An estimated attenuation map may be acquired after multiple iterations. The updated attenuation coefficients of air voxels may be different from the updated attenuation coefficients of bone voxels in the estimated attenuation map. The bone voxels and air voxels in the air/bone ambiguous region can be distinguished based on the estimated attenuation map.

Furthermore, segmenting the first type of medical image into a plurality of sub-regions distinguished from each other. The sub-region may only contain voxels belonging to a variety of organ or tissue. The ambiguous region may be segmented into at least two sub-regions which may belong to different organs or tissues.

Figure 6:
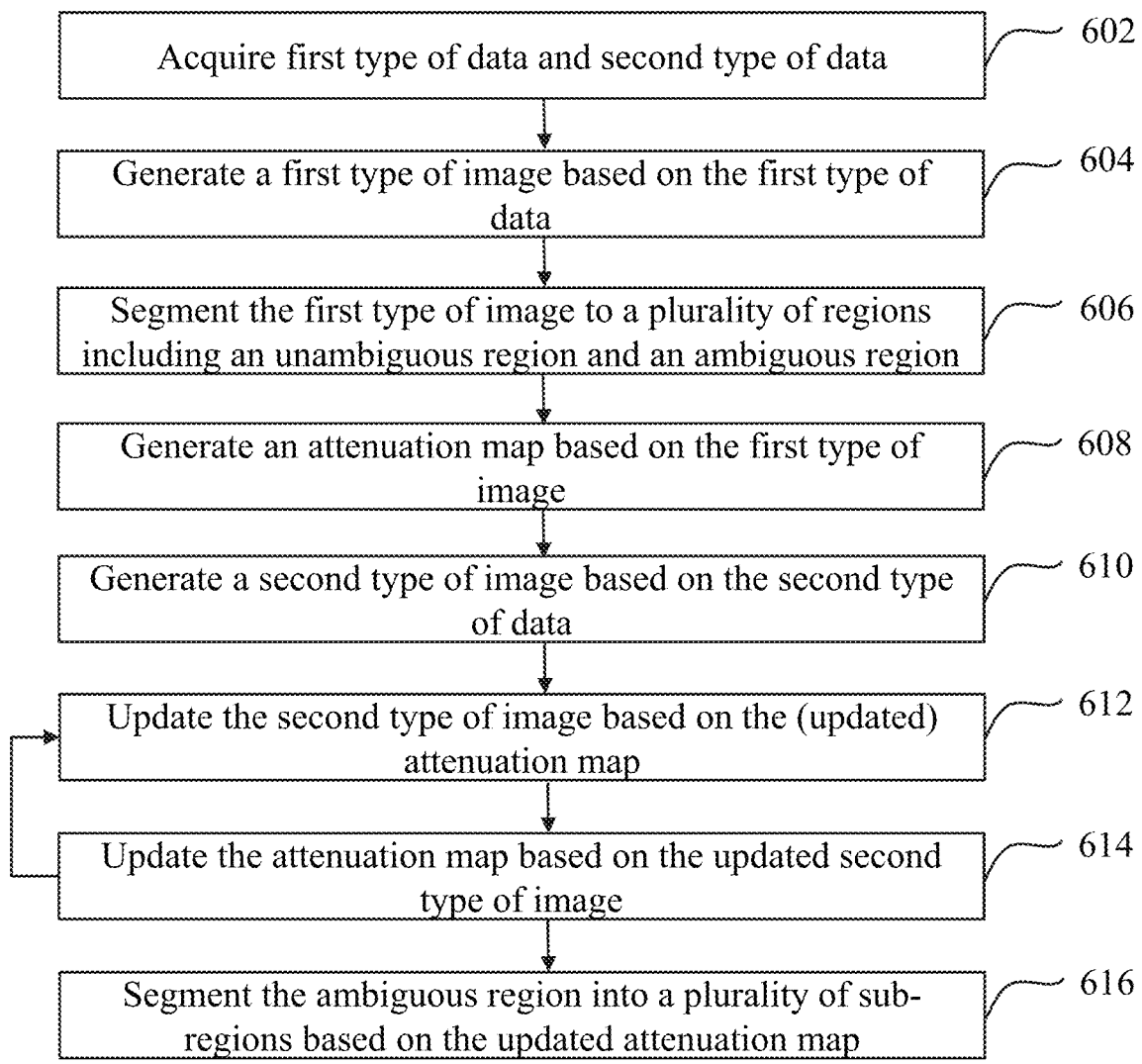
FIG. 6 illustrates another flowchart for segmenting a medical image according to some embodiments of the present disclosure.

FIG. 6 is another exemplary flowchart illustrating a process for processing different types of data according to some embodiments of the present disclosure. In step 602, a first type of data (also referred to as "first data") and a second type of data (also referred to as "second data") may be acquired. The first type of data and the second type of data may be acquired real time or retrieved from any storage disclosed anywhere in the present disclosure. In some embodiments, the first type of data may be anatomic imaging data, and the second type of data may be molecular imaging data or functional imaging data. Merely by way of example, in a hybrid PET/MR system, the first type of data may be MR data and the second type of data may be PET data. The MR data may be acquired by the MR scanner 110, and the PET data may be acquired by the PET scanner 120. The PET data may be corrected with respect to, for example, random coincidences, normalization, dead-time losses, scattering, etc.

In some embodiments, the first type of data and the second type of data may be acquired based on a first scan (e.g., an MR scan) and a second scan (a PET scan) simultaneously or successively in any order. For example, the MR scan may be performed before the PET scan but after injecting PET tracer molecules into the object. As another example, the MR scan may be performed after the PET scan. As a further example, the MR scan may be performed before injecting PET tracer molecules. In some embodiments, the PET tracer may be a single-tracer (e.g., 18F-FDG, 18F-EF5, 18F-ML-10, etc.) or dual-tracer (e.g., 18F-FDG and 18F-FLT, 11C-ACT and 18F-FDG, etc.) for a PET scanning.

In step 604, a first type of image (also referred to as "first image") may be generated based on the first type of data. The generation of the first type of image may be performed by the first reconstruction module 420. For example, in the hybrid PET/MR system, the first type of image may be an MR image reconstructed based on the MR data. The first type of image may include a plurality of voxels corresponding to various organs or tissues.

In step 606, the first type of image may be segmented into a plurality of regions. The plurality of regions may include at least an unambiguous region and at least an ambiguous region. The segmentation may be performed by the segmentation module 430. As used herein, an ambiguous region may refer to that values of voxels in the region may be similar to each other, and therefore the voxels in the region may be undistinguishable from each other. In some embodiments, the ambiguous region may include voxels corresponding to various organs or tissues, and the voxels corresponding to different organs may be undistinguishable from each other according to similar voxel values. The unambiguous region may include voxels corresponding to a specific organ or tissue.

Merely by way of example, in some embodiments, the MR image may be segmented (also referred to as "partitioned") into a plurality of regions. The plurality of regions may include at least an unambiguous region and at least an ambiguous region. The ambiguous region may be an air/bone ambiguous region. The air/bone ambiguous region may include air voxels and bone voxels undistinguishable from each other due to similar voxel values. The unambiguous region may be a soft-tissue region. The soft-tissue region may include voxels of a soft-tissue. Values of the voxels in the soft-tissue region may be similar to each other. The segmentation of the MR image may include the following steps: segmenting the MR image into a plurality of soft-tissue regions that only include voxels of a soft-tissue; excluding the voxels of the soft-tissue regions from the MR image; and acquiring the air/bone ambiguous region. For persons having ordinary skills in the art, during the segmentation of the MR image, a variety of techniques may be used, including a thresholding approach, a region growing approach, a histogram approach, an atlas-guided approach, or a clustering approach, or a combination of two or more of the above approaches, etc.

In some embodiments, the MR image may be segmented based on an atlas-guided approach. The procedure may include three stages: a rigid registration stage, a non-rigid registration stage, and an atlas-guided segmentation stage. In some embodiments, the MR image may be segmented based on the histogram approach identifying the regions or materials according to the values of voxels, and the histogram of voxel datasets over the regions may be acquired by the Formula (1).

In some embodiments, the MR image may be partitioned or segmented into an air/bone ambiguous region, and a plurality of soft-tissue regions. The air/bone ambiguous region may include undistinguishable or mixed air voxels and bone voxels. In the air/bone region, values of the voxels may be similar. The segmentation of the MR image may include: segmenting the MR image into a plurality of soft-tissue regions including only voxels of a soft-tissue; excluding the soft-tissue regions from the MR image; and acquiring the air/bone ambiguous region. The plurality of soft-tissue regions may include a first soft-tissue region and a second soft-tissue region. Merely by way of example, the first soft-tissue region may correspond to the liver, and values of the voxels in the first soft-tissue region may be similar to each other or the same. The second soft-tissue region may correspond to the heart, and values of the voxels in the second soft-tissue region may be similar to each other or the same.

In step 608, an attenuation map may be generated by assigning different attenuation coefficients to voxels belonging to different regions of the first type of image being executed segmentation. In some embodiments, the first type of image may be MR image that is segmented into at least an air/bone ambiguous region, a first soft-tissue region, and a second soft-tissue region as described in step 606. Voxels of the air/bone ambiguous region may be assigned specific attenuation coefficients. In some embodiments, the specific attenuation coefficients may be equal to the attenuation coefficient of water. Voxels of the first soft-tissue region may be assigned a first attenuation coefficient, and voxels of the second soft-tissue region may be assigned a second attenuation coefficient. The first attenuation coefficient may be different from the second attenuation coefficient. For instance, the first attenuation coefficient may be equal to the attenuation coefficient of the liver, and second attenuation coefficienth may be equal to the attenuation coefficient of the cardiac. In some embodiments, the step 606 and the step 608 may be executed in the segmentation module 430.

In step 610, a second type of image (also referred to as "second image") may be generated based on the second type of data. In step 612, the second type of image may be updated or reconstructed based on the (updated) attenuation map. In step 614, the attenuation map may be updated or reconstructed based on the updated second type of image. Step 610, step 612, and step 614 may be performed by the second reconstruction module 440. In some embodiments, the second type of image and the attenuation map may be updated iteratively. As used herein, the updating the second type of image and the attenuation map may be also referred to as an "iterative reconstruction process." In some embodiments, the iterative reconstruction process may include a plurality of iterations. The second type of image and the attenuation map may be updated after each iteration. In some embodiments, an estimated attenuation map and an estimated second type of image may be obtained.

In some embodiments, the second type of image may be a PET image. The reconstruction of the PET image may be based on a time-of-flight (TOF) technique. A difference of detection time of a pair of annihilation gamma-rays may be measured and/or recorded by a TOF based method. The probability of presence of the pair annihilation point in each voxel on the line of response (LOR) may be different depending on the difference of detection time of coincidence events. For example, TOF-PET scan may measure the time difference between the detection of two 511 keV annihilation photons. For the purposes of illustration, taking a reconstruction of the PET image for example, the PET image may be updated based on maximum a posteriori (MAP) method by the second reconstruction module 440. Merely by way of example, a first attenuation map may be generated by assigning attenuation coefficients to voxels of the first type of image on which segmentation is being executed. The iteration reconstruction process may include: updating the PET image based on the first attenuation map, and generating a first PET image; updating the first attenuation map based on the first PET image, and generating a second attenuation map. In some embodiments, a second PET image may be generated based on the second attenuation, and a third attenuation map may be generated based on the second PET image, or the like. The third attenuation map may be referred to as an estimated attenuation map corresponding to a final PET image (also may be referred to as an "estimated PET image"). The final PET image may be a PET image attenuation corrected by the estimated attenuation map. In some embodiments, the iteration reconstruction process may include a plurality of iterations, and the estimated PET image and the estimated attenuation map may be obtained after the final iteration.

In step 616, the ambiguous region may be segmented into a plurality of sub-regions based on the estimated attenuation map. The segmentation may be performed by the second reconstruction module 440. The sub-region may only include voxels belonging to a specific organ or tissue. The ambiguous region may be segmented into at least two sub-regions that may correspond to different organs or tissues. In some embodiments, the voxels of the ambiguous regions may be an air/bone ambiguous region in an MR image on which segmentation has been executed as described in step 606. The air/bone ambiguous region may include air voxels and bone voxels undistinguishable from each other. As described in step 614, the attenuation map may be updated more than once. An estimated attenuation map may be acquired after multiple iteration steps. The updated attenuation coefficients of air voxels may be different from the updated attenuation coefficients of bone voxels in the estimated attenuation map. The bone voxels and the air voxels in the air/bone ambiguous region may be distinguished based on the estimated attenuation map.

It should be noted that, the terms "reconstruct," "estimate," and "update," when used for the generation of the second type of image in this disclosure, may represent a similar process for correcting or otherwise acquiring the second type of data or image. In some embodiments, the terms "reconstruct," "estimate," and "update," when used for the generation of the estimated attenuation map in this disclosure, may represent a similar process for correcting or otherwise acquiring the attenuation coefficients.

Figure 7:
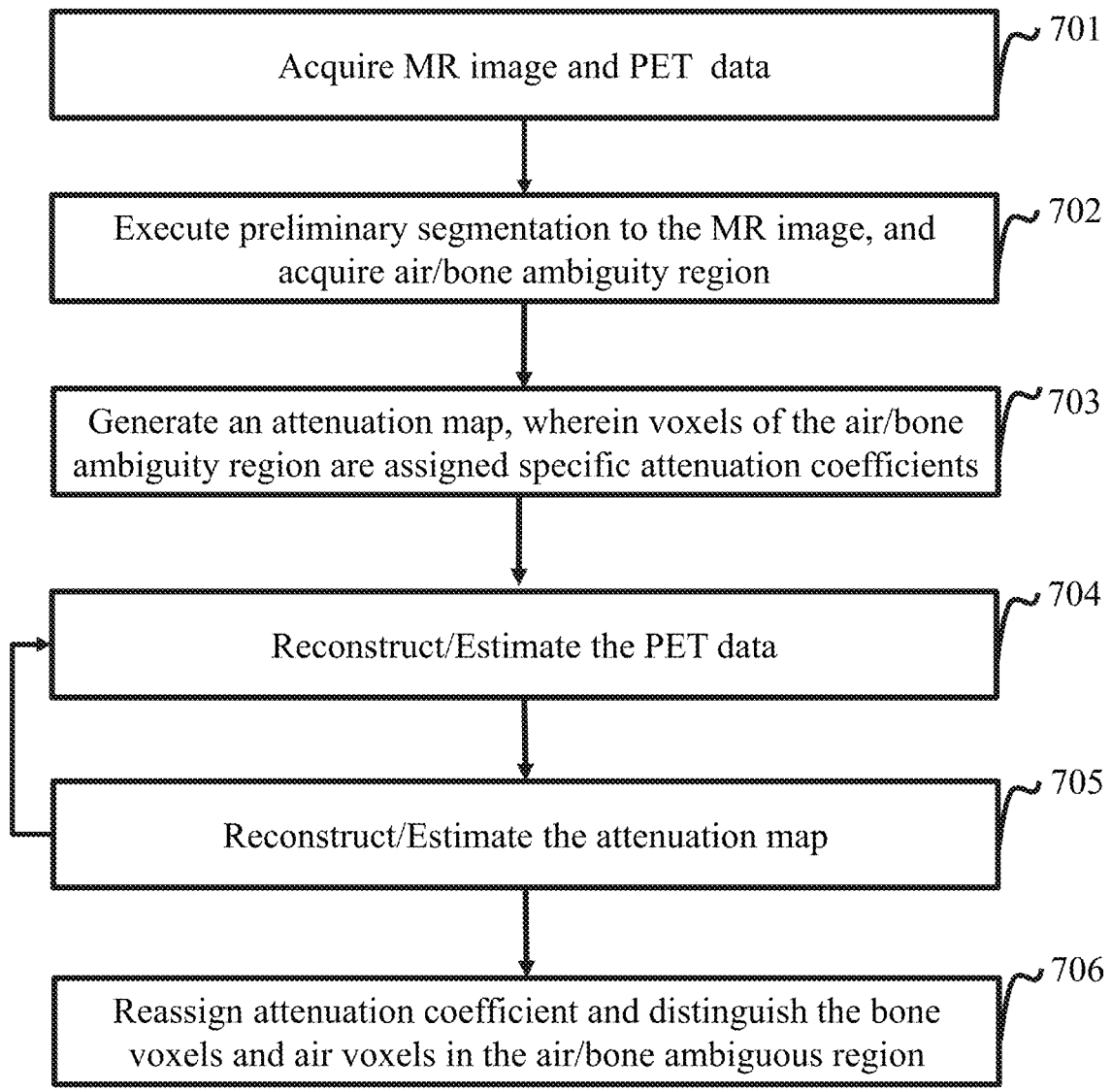
FIG. 7 illustrates a flowchart for segmenting an MR image based on PET data according to some embodiments of the present disclosure.

FIG. 7 is an exemplary flowchart illustrating a process for segmenting a medical image according to some embodiments of the present disclosure. In step 701, a MR image and PET data indicative of a object may be acquired during a scan of object using a hybrid PET/MR apparatus, and the hybrid PET/MR apparatus may include a MR device (imaging system) and a PET device (imaging system). In some embodiments, the MR device may include a MR scanner 110 and a first reconstruction module 420, the MR scanner 110 may generate a plurality of MR data during a scan of an object, and the reconstruction module 420 may generate an MR image by reconstruction the plurality of MR data. The PET device may include a PET scanner 120 which may generate a plurality of PET data during a scan of the object. The MR image may be acquired before or after the acquisition of the PET data. Furthermore, the PET device may include a second reconstruction module 440, which may be used for acquiring a PET image via reconstructing the PET data.

In step 702, execute preliminary segmentation to the MR image, the MR image may be segmented into a plurality of regions which includes at least an air/bone ambiguous region, the air/bone ambiguous region includes indistinguishable or mixed air voxels and bone voxels. For persons having ordinary skills in the art, the MR image partition may use any of variety of the techniques, including but not limited to a thresholding approach, a region growing approach, a histogram approach, an atlas-guided approach, or a clustering approach or combination of one or more of the above approaches with empirical reasoning, etc. In some embodiments, the MR image may be preliminarily partitioned or segmented into an air/bone ambiguous region and a plurality of soft-tissue regions in the segmentation module 430. The air/bone ambiguous region may include air voxels and bone voxels undistinguished or mixed from each other, and values of the voxels in the air/bone ambiguous region may be similar. The plurality of soft-tissue regions may include a first soft-tissue region and the second soft-tissue region. The first soft-tissue region may corresponds to the cardiac, and values of the voxels in the first soft-tissue region may be similar or the same. The second soft-tissue region may correspond to the fat, and values of the voxels in the second soft-tissue region may be similar or the same. The attenuation coefficients corresponding to the cardiac may be different from the attenuation coefficients corresponding to the fat.

Figure 9:
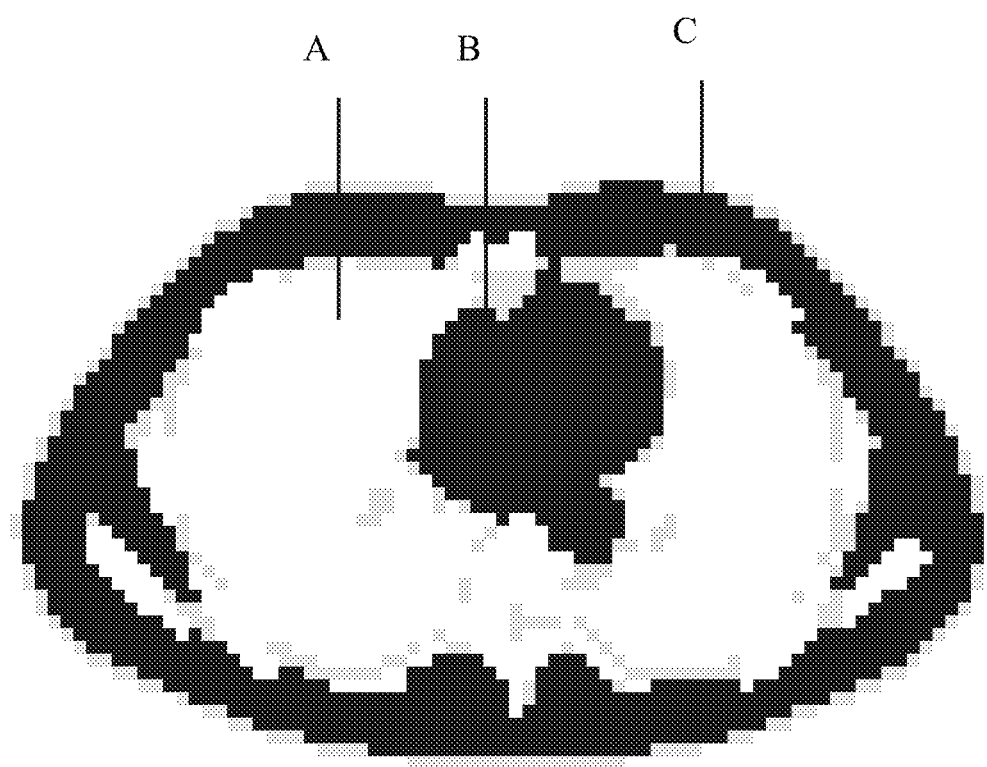
FIG. 9 illustrates a preliminary segmentation of an MR image according to some embodiments of the present disclosure.

In step 703, generate an attenuation map by assigning attenuation coefficients to voxels of the plurality of regions as described in step 702. The air voxels and the bone voxels in the air/bone ambiguous region may be assigned to specific radiation attenuation values, and the specific radiation attenuation values may be equal to attenuation coefficient of water. For example, as illustrated in FIG. 9, voxels of the region A are assigned to the attenuation coefficient of water, voxels of the region B are assigned to attenuation coefficients corresponding to the cardiac or heart, and voxels of the region C are assigned to attenuation coefficients corresponding to the fat. In some embodiments, the step 702 and the step 703 may be executed in the segmentation module 430.

Iteratively reconstruct the PET data based on the attenuation map, and the attenuation map is updated after each iteration of the iteratively reconstruction. An estimated attenuation map may be acquired via iteratively updating or reconstructing the attenuation map during the iterative reconstruction of the PET data. The iteration may contain updating or reconstructing the PET data in step 704 and updating or reconstructing the attenuation map in step 705. In step 704, the PET data may be updated or reconstructed based on the attenuation map. In step 705, the attenuation map may be updated or reconstructed based on the updated PET data. In some embodiments, the attenuation map as described in step 703 may be a first attenuation map, and the first attenuation map may be updated to generate a second attenuation map. In some embodiments, an estimated attenuation map and a PET image may be obtained by iteratively reconstructing the attenuation map and the PET data simultaneously, and the attenuation map may be updated or estimated after each iteration. It should be noted that, the terms "reconstruct", "estimate" and "update", when used for the generation of the PET image in this disclosure, may represent a similar process of the PET data or PET image correction. In some embodiments, the terms "reconstruct", "estimate" and "update", when used for the generation of the estimated attenuation map in this disclosure, may represent a similar process of the attenuation coefficients correction.

In some embodiments, the first attenuation map may be continuously or iteratively updated during a reconstruction of PET data. The reconstruction of the PET data may be based on a time-of-flight (TOF) technique. A detection time difference of a pair of annihilation gamma-rays may be measured and/or recorded by a TOF based method. The probability of presence of the pair annihilation point in each voxel on the line of response (LOR) may be different depending on the detection time difference of coincidence events. For example, TOF-PET scan may measure the time difference between the detection of two 511 keV annihilation photons. For the purposes of illustration, taking a reconstruction of the PET data acquired from the PET scanner 120 for example, the PET data acquired from the PET scanner 120 may be updated based on maximum a posteriori (MAP) method as expressed in Formula (2) below:

$$f_j^{(n,m)} = \max_f y_i^t \log\left(\overline{a}_i^{(n,m)} \sum_{t,i \in S_m} H_{ijt} f_j + s_i(t) + r_i(t)\right) - \quad (2)$$

$$\left(\overline{a}_i^{(n,m)} \sum_{it} H_{ijt} x_j + s_i(t) + r_i(t)\right) - U(f),$$

where $f_j^{(n,m)}$ may denote the PET data or image acquired in the n-th iteration to the m-th sub-iteration of subset; $S_m$ may denote a m-th data subset in data space; $H_{ijt}$ may denote a system matrix including TOF information; i may denote the index number of LOR; j may denote the j-th voxel of PET data or image; t may denote the index number of TOF bin; $s_i(t)$ may denote the number of scattering coincidence events on an i-th LOR of a t-th TOF bin; $r_i(t)$ may denote the number of random coincidence events on an i-th LOR of a t-th TOF bin; $y_i^t$ may denote the number of counts on a i-th LOR of a t-th TOF bin; $U(f)$ may denote a smoothing term of the PET data or image in image domain; $\overline{a}_i^{(n,m)}$ may denote the i-th element of an attenuation sinogram, and the attenuation sinogram may be acquired by a m-th sub-iteration of a subset after n iterations. The value of $\overline{a}_i^{(n,m)}$ may be determined with a formula of:

$$\overline{a}_i = e^{-\Sigma_j l_{ij} \rho_j}, \quad (3)$$

where, $l_{i,j}$ may denote a system matrix of a line integral; $\rho_j$ may denote attenuation coefficient of a voxel j; and the initial value of $\rho_j$ may be equal to attenuation coefficient of water (0.096). For a voxel of a soft-tissue region, the value of $\overline{a}_i^{(n,m)}$ may be determined with a formula of:

$$\overline{a}_i = e^{-\Sigma_{k=1}^M \mu_k \Sigma_j l_{ij} I_k(j)}, \quad (4)$$

where $I_k(j)$ may denote a pixel value of a voxel j.

In some embodiments, for a voxel of a soft-tissue region or an air/bone ambiguous region, the value of $\overline{a}_i^{(n,m)}$ may be determined with the unified formula of:

$$\overline{a}_i = e^{-\Sigma_{k=1}^M \mu_k \Sigma_j l_{ij} I_k(j)} e^{-\Sigma_j l_{ij} \rho_j (1 - \Sigma_{k=1}^M I_k(j))}, \quad (5)$$

where, M is the number of soft-tissue regions in the MR image; $\mu_k$ may denote an attenuation coefficient of one soft-tissue region $(1 \le k \le M)$; $l_{i,j}$ may denote a system matrix of a line integral; i may denote the index number of LOR; $\rho_j$ may denote specific attenuation coefficient of a voxel j; the initial value of $\rho_j$ may be equal to attenuation coefficient of water (0.096); and $I_k(j)$ may denote a pixel value of a voxel j, the value of $I_k(j)$ may be set to one when the voxel is in the k-th soft-tissue region, and in other situations, the value of $I_k(j)$ may be set to zero.

An expectation of a voxel of a non-TOF sinogram may be determined with a formula of:

$$\overline{y}_i^{(n,m)} = \overline{a}_i^{(n,m)} \Sigma_{j,t} H_{ijt} f_j^{(n,m)}, \quad (6)$$

where $\overline{y}_i^{(n,m)}$ may denote an expectation of a voxel of a non-TOF sinogram; the voxel may be one voxel of the PET image, which may have been performed a n-th iteration and a (m)-th sub-iteration.

The attenuation map may be updated based on the updated PET data, an updated attenuation coefficient of the air/bone ambiguous region may be determined with a formula of:

$$\rho_j^{(n,m+1)} = \rho_j^{(n,m)} + \frac{\sum_{i \in S_m} l_{ij} \frac{\overline{y}_i^{(n,m)}}{\overline{y}_i^{(n,m)} + s_i + r_i} (\overline{y}_i^{(n,m)} + s_i + r_i - y_i)}{\sum_{i \in S_m} l_{ij} \frac{(\overline{y}_i^{(n,m)})^2}{\overline{y}_i^{(n,m)} + s_i + r_i} \Sigma_k l_{ik}}, \quad (7)$$

where $\rho_j^{(n,m+1)}$ may denote a second attenuation coefficient of the j-th voxel in the second attenuation map, which may be updated from $\rho_j^{(n,m)}$; $\rho_j^{(n,m)}$ may denote a first attenuation coefficient acquired after performing a n-th iteration to a m-th sub-iteration of the j-th voxel, $l_{ij}$ may denote a system matrix of a line integral, referring to the length of the i-th LOR through a voxel j, which may be generated from an attenuation map corresponding to an attenuation coefficient; $s_i$ may denote the number of scattering coincidence events acquired from the i-th LOR; $r_i$ may denote the number of random coincidence events acquired from the i-th LOR; and $\overline{y}_i^{(n,m)}$ may denote an expectation of i-th voxel of a local PET image corresponding to the air/bone ambiguous region in TOF sinogram, where the local PET image may have been performed a n-th iteration and a (m)-th sub-iteration in the second reconstruction module 440.

An updated or estimated attenuation coefficient of the soft-tissue regions may be determined with a formula of:

$$\mu_p^{(n,m+1)} = \quad (8)$$

$$\mu_p^{(n,m)} + \frac{\sum_{i \in S_m} \frac{\overline{y}_i^{(n,m)}}{\overline{y}_i^{(n,m)} + s_i + r_i} (\overline{y}_i^{(n,m)} + s_i + r_i - y_i) \Sigma_j l_{ij} I_p(j)}{\sum_{i \in S_m} l_{ij} \frac{(\overline{y}_i^{(n,m)})^2}{\overline{y}_i^{(n,m)} + s_i + r_i} (\Sigma_k l_{ik} I_p(j)) \Sigma_k l_{ik}},$$

where $\mu_p^{(n,m+1)}$ may denote a second attenuation coefficient of the p-th soft-tissue region in the second attenuation map, which may be updated from $\mu_p^{(n,m)}$; $\mu_p^{(n,m)}$ may denote a first attenuation coefficient acquired after performing a n-th iteration to a m-th sub-iteration of the p-th soft-tissue region; $l_{ij}$ may denote a system matrix of a line integral, referring to the length of the i-th LOR through a voxel j, which may be generated from an attenuation map corresponding to an attenuation coefficient; $s_i$ may denote the number of scattering coincidence events acquired from the i-th LOR; $r_i$ may denote the number of random coincidence events acquired from the i-th LOR; $\overline{y}_i^{(n,m)}$ may denote an expectation of i-th voxel of the PET image in TOF sinogram, the PET image may have been performed a n-th iteration and a (m)-th sub-iteration.

In some embodiments, one or more iterations may be performed, and an estimated attenuation map may be acquired via iteratively updating the attenuation map during the iterative reconstruction of the second type of data. In some embodiments, keeping an attenuation map (also referred to as a first attenuation map) fixed, an iteration may be performed to a PET data to acquire a PET image, and then keeping the PET image fixed, an iteration may be performed to the first attenuation map to acquire a second PET attenuation image. For one iteration, each subset in data space corresponding to the first attenuation map may be traversed. Then, another iterations may be performed until a criterion is satisfied and the iteration may terminate, the final attenuation map may be the estimated attenuation map. The iterations of the PET data or the generation of the estimated attenuation map may be processed in the second reconstruction module 440.

In step 706, reassign attenuation coefficients to each voxel of an MR image based on the estimated attenuation map, and distinguish the bone voxels and air voxels in the air/bone ambiguous region. The attenuation coefficient of air being updated is different from the attenuation coefficient of bone being updated, and the bone voxels and air voxels in the air/bone ambiguous region can be distinguished based on the updated attenuation map. Furthermore, segment the MR image into a plurality of sub-regions distinguished from each other, wherein the air/bone ambiguous region may be segmented into a first sub-region and a second sub-region, the first sub-region may only include the bone voxels, and the second sub-region may only include the air voxels.

Figure 8:
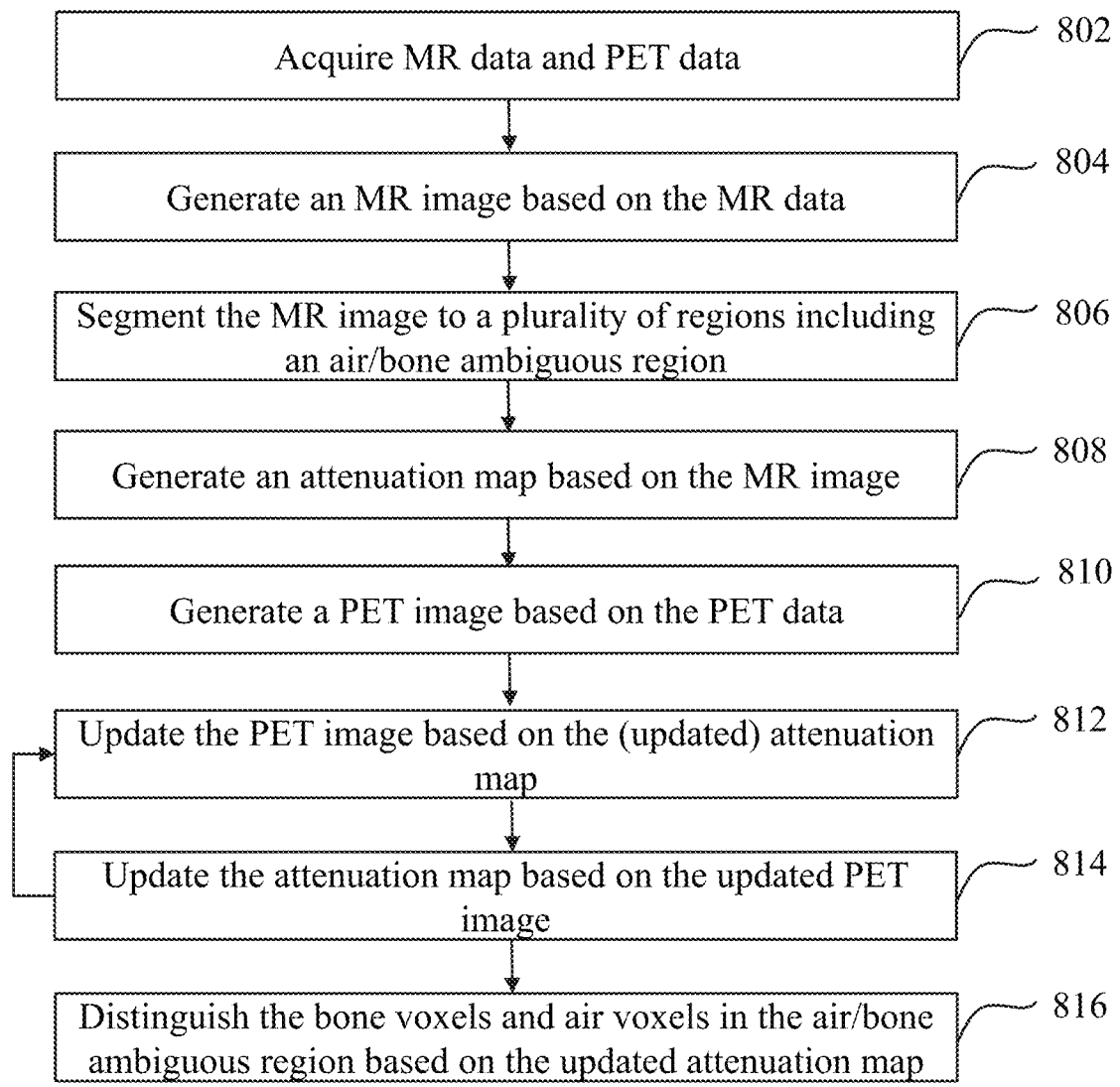
FIG. 8 illustrates another flowchart for segmenting an MR image based on PET data according to some embodiments of the present disclosure.

FIG. 8 is another exemplary flowchart illustrating a process for segmenting an image according to some embodiments of the present disclosure. In step 802, MR data and PET data may be acquired. In some embodiments, the MR data and the PET data may be acquired during a scan of an object by a hybrid PET/MR apparatus (e.g., the imaging system 100). The hybrid PET/MR apparatus may include an MR device (e.g., the MR scanner 110), a PET device (e.g., the PET scanner 120), and a processing device (e.g., the image processor 130. In some embodiments, the MR data and PET data may be retrieved from a storage disclosed anywhere in the present disclosure. In some embodiments, the MR data and the PET data may be acquired simultaneously or successively.

In step 804, an MR image may be generated based on the MR data. In some embodiments, the MR image may be generated by the first reconstruction module 420. In some embodiments, the MR image may be generated before or after the acquisition of the PET data.

In step 806, the MR image may be segmented (also referred to as "partitioned") into a plurality of regions including at least an air/bone ambiguous region. The segmentation may be performed by the segmentation module 430. For persons having ordinary skills in the art, during the segmentation of the MR image, a variety of techniques may be used, including a thresholding approach, a region growing approach, a histogram approach, an atlas-guided approach, a clustering approach, or a combination of two or more of the above approaches, etc.

In some embodiments, the MR image may be segmented into an air/bone ambiguous region and one or more soft-tissue regions. The air/bone ambiguous region may include air voxels and bone voxels undistinguishable from each other, and values of the voxels in the air/bone ambiguous region may be similar or the same. The one or more soft-tissue regions may include a first soft-tissue region and a second soft-tissue region. The first soft-tissue region may correspond to the heart of the subject, and values of the voxels in the first soft-tissue region may be similar or the same. The second soft-tissue region may correspond to fat, and values of the voxels in the second soft-tissue region may be similar or the same. In some embodiments, the attenuation coefficients corresponding to the heart may be different from the attenuation coefficients corresponding to the fat. For example, as described in FIG. 9, an MR image regarding the head may be segmented into three regions including region A (air/bone ambiguous region), region B corresponding to the heart, and region C corresponding to the fat.

In step 808, an attenuation map may be generated by assigning attenuation coefficients to voxels of the plurality of regions as described in step 806. The attenuation map may be generated by the segmentation module 430. In some embodiments, the air voxels and the bone voxels in the air/bone ambiguous region may be assigned to a specific attenuation coefficient. In some embodiments, the specific attenuation coefficient may be equal to the attenuation coefficient of water. For example, as illustrated in FIG. 9, voxels of the region A are assigned the attenuation coefficient of water, voxels of the region B are assigned the attenuation coefficients corresponding to the heart, and voxels of the region C are assigned the attenuation coefficients corresponding to the fat.

In step 810, a PET image may be generated based on the PET data. In some embodiments, the PET image may be generated by the second reconstruction module 440. As used herein, the PET image may be an initial image generated based on the PET data. In step 812, the PET image may be updated based on the attenuation map. In step 814, the attenuation map may be updated based on the updated PET image. Subsequently, the PET image may be updated based on the updated attenuation map. In some embodiments, the PET image and the attenuation map may be updated iteratively. In some embodiments, an estimated attenuation map and an estimated PET image may be acquired. As used herein, the updating the PET image and the attenuation map may be also referred to as an "iterative reconstruction process." In some embodiments, the iteration reconstruction process may include a plurality of iterations, and the attenuation map may be updated after each iteration.

In some embodiments, the PET image may be generated based on a time-of-flight (TOF) technique. A difference of detection time between a pair of annihilation gamma-rays may be measured and/or recorded by a TOF based method. The probability of presence of the pair of annihilation point in each voxel on the line of response (LOR) may be different depending on the difference of detection time of coincidence events. For example, TOF-PET scan may measure the time difference between the detection of two 511 keV annihilation photons. For the purposes of illustration, the PET image may be updated based on maximum a posteriori (MAP) method as expressed in the Formula (2).

In step 814, the attenuation map may be updated based on the updated PET image. In some embodiments, the tissue regions and the air/bone ambiguous regions in the attenuation map may be updated respectively. For example, the air/bone ambiguous region may be updated expressed in the Formula (7), and the attenuation coefficients of a soft-tissue region may be updated expressed in the Formula (8).

In some embodiments, one or more iterations may be performed, and an estimated attenuation map may be acquired via iteratively updating the attenuation map during the iterative reconstruction process. In an iteration, both the PET image and the attenuation map may be updated. Merely by way of example, keeping an attenuation map (also referred to as a first attenuation map) fixed, a round of reconstruction may be performed to the PET data to acquire a PET image, and then keeping the PET image fixed, the first attenuation map may be updated to acquire a second PET attenuation image. During one iteration, each subset in data space corresponding to the first attenuation map may be traversed and/or updated. Then, one or more iterations may be performed until a criterion is satisfied and the iteration may terminate, a final attenuation map may be generated (also referred to as "the estimated attenuation map"). Exemplary criteria may include the number of iterations to be performed, the change in a value (e.g., the PET image, the attenuation map, etc.) in a number of iterations lower than a threshold, or the like, or a combination thereof.

In step 816, the bone voxels and the air voxels in the air/bone ambiguous region may be distinguished based on the updated attenuation map (also referred to as the "estimated attenuation map"). For example, voxels in the MR image may be reassigned attenuation coefficients based on the estimated attenuation map. The attenuation coefficients of air being updated is different from the attenuation coefficients of bone being updated, and the bone voxels and air voxels in the air/bone ambiguous region may be distinguished based on the updated attenuation map or their respective attenuation coefficients. Furthermore, the MR image may be segmented into a plurality of sub-regions distinguished from each other. For example, the air/bone ambiguous region may be segmented into a first sub-region including bone voxels and a second sub-region including air voxels.

It should be noted that, the terms "reconstruct," "estimate," and "update," when used for the generation of the PET image in this disclosure, may represent a similar process for correcting or otherwise acquiring the PET data or PET image. In some embodiments, the terms "reconstruct," "estimate," and "update," when used for the generation of the estimated attenuation map in this disclosure, may represent a similar process for correcting or otherwise acquiring the attenuation coefficients.

EXAMPLES

The following examples are provided for illustration purposes only, and not intended to limit the scope of the present disclosure.

Example 1

FIG. 9 illustrates a preliminary segmentation of an MR image. The MR image shown here is the transversal view of the torso. Two levels of grey scale values may be seen in FIG. 9. The MR image was preliminarily segmented into region A, region B, and region C. The region B may include voxels of the heart with a similar grey value, and the region C may include voxels of fat with a similar grey value. The region A may include voxels belonging to different organs, and the voxels were difficult to distinguish due to similar voxel values. Region A may include voxels of the spine, voxels of a rib, voxels of a lung, or voxels of air.

Example 2

Figure 10:
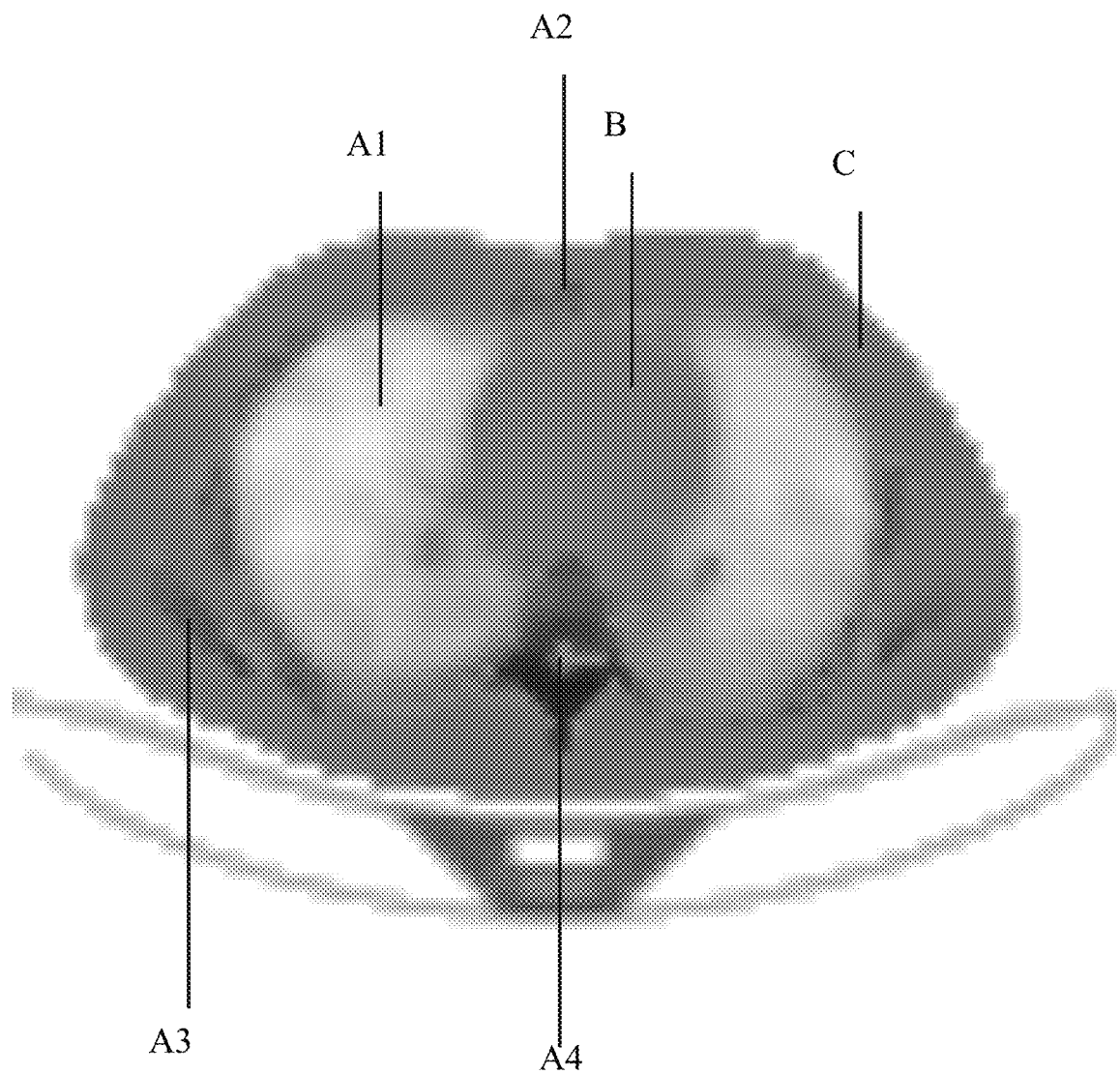
FIG. 10 illustrates an estimated attenuation map according to some embodiments of the present disclosure.

FIG. 10 illustrates an estimated attenuation map generated according to some embodiments of the present disclosure. At least three levels of grey scale values may be seen in FIG. 10. Different portions of the estimated attenuation map had different grey scale values (or different attenuation coefficients). The grey scale values of the spine and the grey scale values of the ribs were higher than the grey scale values of other regions in the estimated attenuation map, indicating the estimated or updated attenuation coefficients corresponding to the spine or ribs were higher than the estimated or updated attenuation coefficients corresponding to the soft tissue(s). The grey scale values corresponding to the lung were lower than the grey scale values corresponding to other regions in the estimated attenuation map, indicating the estimated or updated attenuation coefficients corresponding to the lung were lower than the estimated or updated attenuation coefficients corresponding to the soft tissues. Simple thresholding segmentation according to attenuation coefficients may lead to separation of lungs and bones. The MR image may be segmented into a plurality of sub-regions including region A1, region A2, region A3, region A4, region B, and region C. The region A1 may include only voxels of a lung or air, the regions A2 and A3 may include only voxels of the ribs, and the regions A4 may include only voxels of the spine.

The various methods and techniques described above provide a number of ways to carry out the application. Of course, it is to be understood that not necessarily all objectives or advantages described can be achieved in accordance with any particular embodiment described herein. Thus, for example, those skilled in the art will recognize that the methods may be performed in a manner that achieves or optimizes one advantage or group of advantages as taught herein without necessarily achieving other objectives or advantages as taught or suggested herein. A variety of alternatives are mentioned herein. It is to be understood that some preferred embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, may be employed in various combinations by one of ordinary skill in this art to perform methods in accordance with the principles described herein. Among the various elements, features, and steps some will be specifically included and others specifically excluded in diverse embodiments.

Although the application has been disclosed in the context of certain embodiments and examples, it will be understood by those skilled in the art that the embodiments of the application extend beyond the specifically disclosed embodiments to other alternative embodiments and/or uses and modifications and equivalents thereof.

Preferred embodiments of this application are described herein. Variations on those preferred embodiments will become apparent to those of ordinary skill in the art upon reading the foregoing description. It is contemplated that skilled artisans may employ such variations as appropriate, and the application may be practiced otherwise than specifically described herein. Accordingly, many embodiments of this application include all modifications and equivalents of the object matter recited in the claims appended hereto as permitted by applicable law. Moreover, any combination of the above-described elements in all possible variations thereof is encompassed by the application unless otherwise indicated herein or otherwise clearly contradicted by context.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method for segmenting a medical image, including:
acquiring a first type of medical image via reconstructing a first type of data obtained in a scan of an object using a first scanner, wherein the first type of medical image comprises a plurality of voxels;
acquiring a second type of data for reconstructing a second type of medical image, wherein the second type of data is obtained in a scan of the object using a second scanner;
obtaining at least an unambiguous region and at least an air/bone ambiguous region by executing preliminary segmentation to the first type of medical image, wherein the air/bone ambiguous region includes air voxels and bone voxels undistinguished from each other;
generating an initial attenuation map by assigning attenuation coefficients to voxels belonging to different regions of the segmented first type of medical image, wherein the voxels of the at least one air/bone ambiguous region are assigned at least one specific attenuation coefficient without differentiating the air voxels and the bone voxels in the at least one air/bone ambiguous region;
generating the second type of medical image and an estimated attenuation map by performing, based on the second type of data and the initial attenuation map, iterative reconstruction;
reassigning attenuation coefficients to the voxels of the first type of medical image based on the estimated attenuation map; and
segmenting the first type of medical image into a plurality of sub-regions distinguished from each other based on the reassigned attenuation coefficients.

2. The method of claim 1, wherein the first type of medical image is a magnetic resonance (MR) image, the second type of medical image is a positron emission tomography (PET) image.

3. The method of claim 1, wherein the unambiguous region comprises at least a soft-tissue region.

4. The method of claim 3, wherein values of the voxels in the soft-tissue region are similar to each other, and values of the voxels in the air/bone ambiguous region are similar to each other.

5. The method of claim 1, wherein the at least one specific attenuation coefficient is equal to an attenuation coefficient of water.

6. The method of claim 3, wherein the unambiguous region comprises a first soft-tissue region and a second soft-tissue region, and the voxels of the first soft-tissue region are assigned a first attenuation coefficient, and the voxels of the second soft-tissue region are assigned a second attenuation coefficient.

7. The method of claim 6, wherein the first attenuation coefficient or the second attenuation coefficient is updated after each iteration.

8. The method of claim 1, wherein the attenuation coefficient of each voxel in the air/bone ambiguous region is updated after each iteration.

9. A system for segmenting a medical image, the system comprising:
at least one image processor configured to:
acquire a first type of medical image via reconstructing a first type of data obtained in a scan of an object using a first scanner, wherein the first type of medical image includes a plurality of voxels;
acquire a second type of data for reconstructing a second type of medical image, wherein the second type of data is obtained in a scan of the object using a second scanner;
obtain at least a soft-tissue region and at least an air/bone ambiguous region by executing preliminary segmentation to the first type of medical image, wherein the air/bone ambiguous region includes air voxels and bone voxels undistinguished from each other, and the soft-tissue region includes only voxels of soft-tissue;
generate an initial attenuation map by assigning attenuation coefficients to voxels belonging to different regions of the segmented first type of medical image, wherein the voxels of the at least one air/bone ambiguous region are assigned at least one specific attenuation coefficient without differentiating the air voxels and the bone voxels in the at least one air/bone ambiguous region;
generate the second type of medical image and an estimated attenuation map by performing, based on the second type of data and the initial attenuation map, iterative reconstruction; and
reassigning attenuation coefficients to the voxels of the first type of medical image based on the estimated attenuation map.

10. The system of claim 9, wherein the at least one image processor is further configured to segment the air/bone ambiguous region into a first region, a second region, and a third region, wherein the first region comprises only voxels of a rib, the second region comprises only voxels of a spine, and the third region comprises only voxels of a lung.

11. The system of claim 10, wherein the attenuation coefficient corresponding to the bone voxels in the first region are different from the attenuation coefficient corresponding to the air voxels in the second region.

12. The system of claim 9, further comprising:
the first scanner configured to obtain the first type of data by performing a first scan of an object;
the second scanner configured to obtain the second type of data by performing a second scan of the object; and
a display configured to simultaneously display the first type of medical image and the second type of medical image in an overlaying manner.

13. The system of claim 9, wherein the first type of medical image is a magnetic resonance (MR) image, and the second type of medical image is a positron emission tomography (PET) image.

14. The system of claim 9, wherein the first scanner is an MR scanner, and the second scanner is a PET scanner.

15. The system of claim 9, wherein the generating of the second type of medical image and the estimated attenuation map by performing, based on the second type of data and the initial attenuation map, iterative reconstruction includes:
generating an initial second type of medical image based on the second type of data and the initial attenuation map;
performing a plurality of iterations for generating the second type of medical image and the estimated attenuation map, each iteration of the plurality of iterations including:
generating an updated attenuation map based on a prior attenuation map and a prior second type of medical image, the prior second type of medical image and the prior attenuation map being the initial second type of medical image and the initial attenuation map in a first iteration of the plurality of iterations, or an updated second type of medical image and an updated attenuation map generated in a prior iteration, respectively; and generating an updated second type of medical image based on the second type of data and the updated attenuation map; and designating the updated second type of medical image and the updated attenuation map generated in a last iteration of the plurality of iterations as the second type of medical image and the estimated attenuation map.

16. The method of claim 1, wherein the first scanner is an MR scanner, and the second scanner is a PET scanner.

17. The method of claim 1, wherein the segmenting of the first type of medical image into the plurality of sub-regions distinguished from each other based on the reassigned attenuation coefficients includes:

segmenting the air/bone ambiguous region into a first region and a second region, wherein the first region includes only the bone voxels and the second region includes only the air voxels.

18. The method of claim 1, wherein the generating of the second type of medical image and the estimated attenuation map by performing, based on the second type of data and the initial attenuation map, iterative reconstruction includes:

generating an initial second type of medical image based on the second type of data and the initial attenuation map;

performing a plurality of iterations for generating the second type of medical image and the estimated attenuation map, each iteration of the plurality of iterations including:

generating an updated attenuation map based on a prior attenuation map and a prior second type of medical image, the prior second type of medical image and the prior attenuation map being the initial second type of medical image and the initial attenuation map in a first iteration of the plurality of iterations, or an updated second type of medical image and an updated attenuation map generated in a prior iteration, respectively; and generating an updated second type of medical image based on the second type of data and the updated attenuation map; and designating the updated second type of medical image and the updated attenuation map generated in a last iteration of the plurality of iterations as the second type of medical image and the estimated attenuation map.

19. The method of claim 2, wherein the MR image is segmented based on at least one approach selected from a thresholding approach, a region growing approach, a histogram approach, an atlas-guided approach, or a clustering approach.

20. The method of claim 3, wherein the obtaining the air/bone ambiguous region includes:

excluding the voxels of the at least a soft-tissue region from the first type of medical image.

* * * * *